(12) United States Patent
Baek et al.

(10) Patent No.: US 12,225,787 B2
(45) Date of Patent: Feb. 11, 2025

(54) DISPLAY DEVICE

(71) Applicant: Samsung Display Co., LTD., Yongin-si (KR)

(72) Inventors: Gyung Min Baek, Yongin-si (KR); Tae Wook Kang, Seongnam-si (KR); Shin Il Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 599 days.

(21) Appl. No.: 17/489,120

(22) Filed: Sep. 29, 2021

(65) Prior Publication Data

US 2022/0199745 A1 Jun. 23, 2022

(30) Foreign Application Priority Data

Dec. 22, 2020 (KR) .......................... 10-2020-0180674

(51) Int. Cl.
 *H10K 59/131* (2023.01)
 *H10K 59/121* (2023.01)
 *H10K 59/124* (2023.01)

(52) U.S. Cl.
 CPC ....... *H10K 59/131* (2023.02); *H10K 59/1213* (2023.02); *H10K 59/124* (2023.02)

(58) Field of Classification Search
 None
 See application file for complete search history.

(56) References Cited

U.S. PATENT DOCUMENTS

| | | | |
|---|---|---|---|
| 10,347,866 B1* | 7/2019 | Kim | H10K 50/8445 |
| 2015/0131017 A1* | 5/2015 | Ro | H01L 27/1262 349/110 |
| 2019/0041915 A1* | 2/2019 | Park | H10K 59/1213 |
| 2019/0164995 A1* | 5/2019 | Lee | H10K 77/111 |
| 2020/0272007 A1* | 8/2020 | Yang | G02F 1/136286 |
| 2020/0395428 A1 | 12/2020 | Baek et al. | |
| 2021/0320278 A1* | 10/2021 | Chung | H10K 71/00 |
| 2022/0181583 A1* | 6/2022 | Kim | H10K 59/12 |

FOREIGN PATENT DOCUMENTS

| | | |
|---|---|---|
| KR | 10-2016-0044171 | 4/2016 |
| KR | 10-2016-0081101 | 7/2016 |

* cited by examiner

*Primary Examiner* — Alexander G Ghyka
(74) *Attorney, Agent, or Firm* — KILE PARK REED & HOUTTEMAN PLLC

(57) ABSTRACT

A display device includes a substrate including a display area and a pad area, a transistor including an active layer disposed in the display area, a gate electrode disposed on the active layer, and a source electrode and a drain electrode disposed on the gate electrode, a fan-out line disposed in the pad area, an auxiliary line disposed on the fan-out line, a first interlayer insulating layer disposed between the gate electrode and the source electrode and between the fan-out line and the auxiliary line, and a first organic layer disposed between the first interlayer insulating layer and the auxiliary line, wherein the first organic layer does not overlap the display area.

20 Claims, 19 Drawing Sheets

DISPLAY DEVICE

CROSS-REFERENCE TO RELATED APPLICATION(S)

This application claims priority from Korean Patent Application No. 10-2020-0180674 filed on Dec. 22, 2020, in the Korean Intellectual Property Office, the disclosure of which is incorporated herein by reference in its entirety.

BACKGROUND

1. Technical Field

The disclosure relates to a display device.

2. Description of Related Art

The importance of display devices is increasing along with the development of multimedia. Accordingly, various types of display devices, such as organic light-emitting diode (OLED) displays and liquid crystal displays (LCDs), are being used.

Display devices are devices that display an image and include a display panel such as an organic light-emitting display panel or a liquid crystal display panel. Among these, the display device may include light-emitting elements as a light-emitting display panel. For example, a light-emitting diode (LED) may include an OLED that uses an organic material as a light-emitting material, an inorganic light-emitting diode that uses an inorganic material as a light-emitting material, or the like.

SUMMARY

Aspects of the disclosure provide a display device in which an interval between lines is secured in a non-display area, thereby preventing the lines from being short-circuited with each other or burnt.

It should be noted that objects of the disclosure are not limited to the above-described objects, and other objects of the disclosure will be apparent to those skilled in the art from the following descriptions.

According to an embodiment of the disclosure, the display device may comprise a substrate including a display area and a pad area, a transistor including an active layer disposed in the display area, a gate electrode disposed on the active layer, and a source electrode and a drain electrode disposed on the gate electrode, a fan-out line disposed in the pad area, an auxiliary line disposed on the fan-out line, a first interlayer insulating layer disposed between the gate electrode and the source electrode and between the fan-out line and the auxiliary line, and a first organic layer disposed between the first interlayer insulating layer and the auxiliary line. The first organic layer may not overlap the display area.

In an embodiment, the first interlayer insulating layer may include at least one selected from among silicon oxide, silicon nitride, silicon oxynitride, aluminum oxide, zirconium oxide, and aluminum nitride.

In an embodiment, the first organic layer may include at least one selected from among an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, and polycarbonate.

In an embodiment, the first organic layer may contact each of the first interlayer insulating layer and the auxiliary line.

In an embodiment, the display device may further comprise a gate insulating layer disposed between the active layer and the gate electrode and under the fan-out line. The gate electrode and the fan-out line may contact an upper surface of the gate insulating layer.

In an embodiment, the source electrode, the drain electrode, and the auxiliary line may be disposed on different layers and may include a same material.

In an embodiment, the display device may further comprise a second interlayer insulating layer disposed on the source electrode, the drain electrode, and the auxiliary line, a voltage line disposed in the display area and a second organic layer disposed in the pad area on the second interlayer insulating layer, a voltage line disposed on the second organic layer and extending from the display area, and a third interlayer insulating layer disposed on the voltage line and the second organic layer.

In an embodiment, the second interlayer insulating layer and the third interlayer insulating layer may include at least one selected from among silicon oxide, silicon nitride, silicon oxynitride, aluminum oxide, zirconium oxide, and aluminum nitride, and the second organic layer includes at least one selected from among an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, and polycarbonate.

In an embodiment, the second organic layer may not overlap the display area and overlap the first organic layer.

In an embodiment, the second organic layer may contact each of the second interlayer insulating layer and the third interlayer insulating layer.

In an embodiment, the display device may further comprise a first electrode and a second electrode extending in a direction and spaced apart from each other on the third interlayer insulating layer in the display area, a light-emitting element having a first end portion and a second end portion disposed on the first electrode and the second electrode, respectively, a first connection electrode electrically connected to the first end portion of the light-emitting element, and a second connection electrode electrically connected to the second end portion of the light-emitting element.

In an embodiment, the light-emitting element may include a first semiconductor layer, a second semiconductor layer disposed on the first semiconductor layer, a light-emitting layer disposed between the first semiconductor layer and the second semiconductor layer, and an insulating film surrounding the first semiconductor layer, the second semiconductor layer, and the light-emitting layer.

According to an embodiment of the disclosure, the display device may comprise a substrate including a display area, a pad area, and a seal area, a transistor including an active layer disposed in the display area, a gate electrode disposed on the active layer, and a source electrode and a drain electrode disposed on the gate electrode, a fan-out line disposed in the pad area and an auxiliary line disposed on the fan-out line, a first interlayer insulating layer disposed between the gate electrode and the source electrode, between the fan-out line and the auxiliary line, and in the seal area, a first organic layer disposed between the first interlayer insulating layer and the auxiliary line, and an adhesive member disposed on the first interlayer insulating layer in the seal area, wherein the first organic layer does not overlap the display area and the pad area.

In an embodiment, the first organic layer may contact each of the first interlayer insulating layer and the auxiliary line.

In an embodiment, the display device may further comprise a gate insulating layer disposed between the active layer and the gate electrode and under the fan-out line, wherein the gate electrode and the fan-out line may contact an upper surface of the gate insulating layer.

In an embodiment, the source electrode, the drain electrode, and the auxiliary line may be disposed on different layers and may include a same material.

In an embodiment, the display device may further comprise a second interlayer insulating layer disposed on the source electrode and the drain electrode in the display area, the auxiliary line in the pad area, and the first interlayer insulating layer in the seal area, a second organic layer disposed on the second interlayer insulating layer in the pad area, a voltage line disposed on the second interlayer insulating layer in the display area and the second organic layer, and a third interlayer insulating layer disposed on the voltage line and the second organic layer.

In an embodiment, the second organic layer may not overlap the display area and the seal area and overlap the first organic layer.

In an embodiment, the display device may further comprise a first electrode and a second electrode extending in a direction and spaced apart from each other on the third interlayer insulating layer in the display area, a light-emitting element having a first end portion and a second end portion disposed on the first electrode and the second electrode, respectively, a first connection electrode electrically connected to the first end portion of the light-emitting element, and a second connection electrode electrically connected to the second end portion of the light-emitting element.

In an embodiment, the display device may further comprise an encapsulation layer overlapping the first connection electrode and the second connection electrode and disposed in the display area and the seal area. The gate insulating layer, the first interlayer insulating layer, the second interlayer insulating layer, the third interlayer insulating layer, and the encapsulation layer may be disposed in the seal area, and the adhesive member is disposed on the encapsulation layer.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

The phrase "at least one of" is intended to include the meaning of "at least one selected from the group of" for the purpose of its meaning and interpretation. For example, "at least one of A and B" may be understood to mean "A, B, or A and B."

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, specific embodiments will be described with reference to the accompanying drawings.

Figure 1:
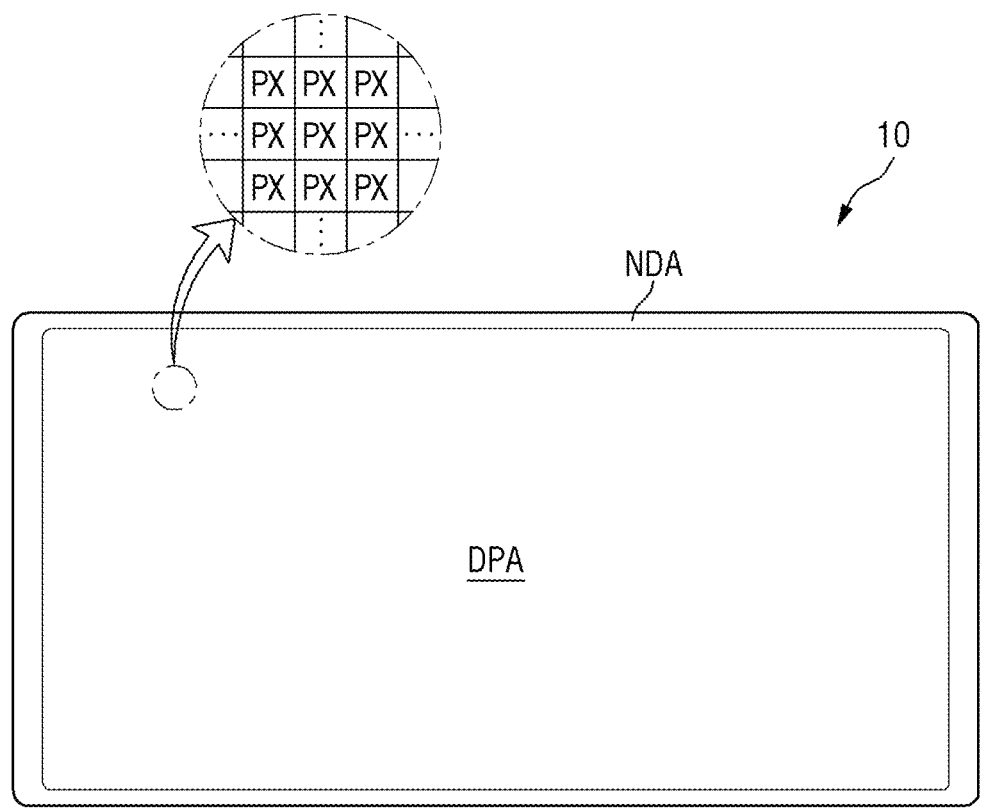
FIG. 1 is a schematic plan view of a display device according to an embodiment.

FIG. 1 is a schematic plan view of a display device according to an embodiment.

In the specification, with respect to a display device 10, the terms "upper," "top," and "upper surface" refer to an upper direction, for example, a direction of a third direction DR3, and the terms "lower," "bottom," and "lower surface" refer to the other direction of the third direction DR3. The terms "left," "right," "upper," and "lower" refer to directions when the display device 10 is viewed in a plan view. For example, the term "left" refers to a direction of a first direction DR1, the term "right" refers to the other direction of the first direction DR1, the term "upper" refers to a direction of a second direction DR2, and the term "lower" refers to the other direction of the second direction DR2.

Referring to FIG. 1, the display device 10 may display a video or a still image. The display device 10 may refer to an electronic device that provides a display screen. For example, the display device 10 may include a television, a laptop computer, a monitor, a billboard, a device for the Internet of Things, a mobile phone, a smartphone, a tablet personal computer (PC), an electronic watch, a smartwatch, a watch phone, a head-mounted display, a mobile communication terminal, an electronic notebook, an e-book reader, a portable multimedia player (PMP), a navigation system, a game console, a digital camera, and a camcorder, which are provided with a display screen.

The display device 10 may include a display panel that provides a display screen. Examples of the display panel may include an inorganic light-emitting diode display panel, an organic light-emitting display panel, a quantum dot light-emitting display panel, a plasma display panel, a field emission display panel, and the like. Hereinafter, although an example is described in which the inorganic light-emitting diode display panel is applied, the disclosure is not limited thereto, and a device to which the same technical spirit is applicable may be applied to other display panels.

A shape of the display device 10 may be variously changed. For example, the display device 10 may have shapes such as a rectangular shape of which lateral sides are long (or elongated), a rectangular shape of which longitudinal sides are long, a square shape, a quadrangular shape of which corner portions (vertexes) are round, other polygonal shapes, a circular shape, and the like. A shape of a display area DPA of the display device 10 may also be similar to an overall shape of the display device 10. FIG. 1 illustrates the display device 10 and the display area DPA, which have the rectangular shape of which lateral sides are long.

The display device 10 may include the display area DPA and a non-display area NDA. The display area DPA is an area in which an image may be displayed, and the non-display area NDA is an area in which an image is not displayed. The display area DPA may be referred to as an active area, and the non-display area NDA may be referred to as an inactive area. The display area DPA may substantially occupy a center of the display device 10.

The display area DPA may include pixels PX. The pixels PX may be arranged in matrix form. A shape of each pixel PX may be a rectangular shape or a square shape in a plan view, but is not limited thereto, and the shape may be a rhombic shape of which each side is inclined with respect to a direction. The pixels PX may be alternately arranged in a stripe type or a PENTILE® type. Each of the pixels PX may include one or more light-emitting elements 300 that emit light at a specific wavelength, thereby displaying a specific color.

The non-display area NDA may be disposed around the display area DPA. The non-display area NDA may completely or partially surround the display area DPA. The display area DPA has a rectangular shape, and the non-display area NDA may be disposed adjacent to the four sides of the display area DPA. The non-display area NDA may form a bezel of the display device 10. In each non-display area NDA, lines or circuit drivers included in the display device 10 may be disposed, or external devices may be mounted.

Figure 2:
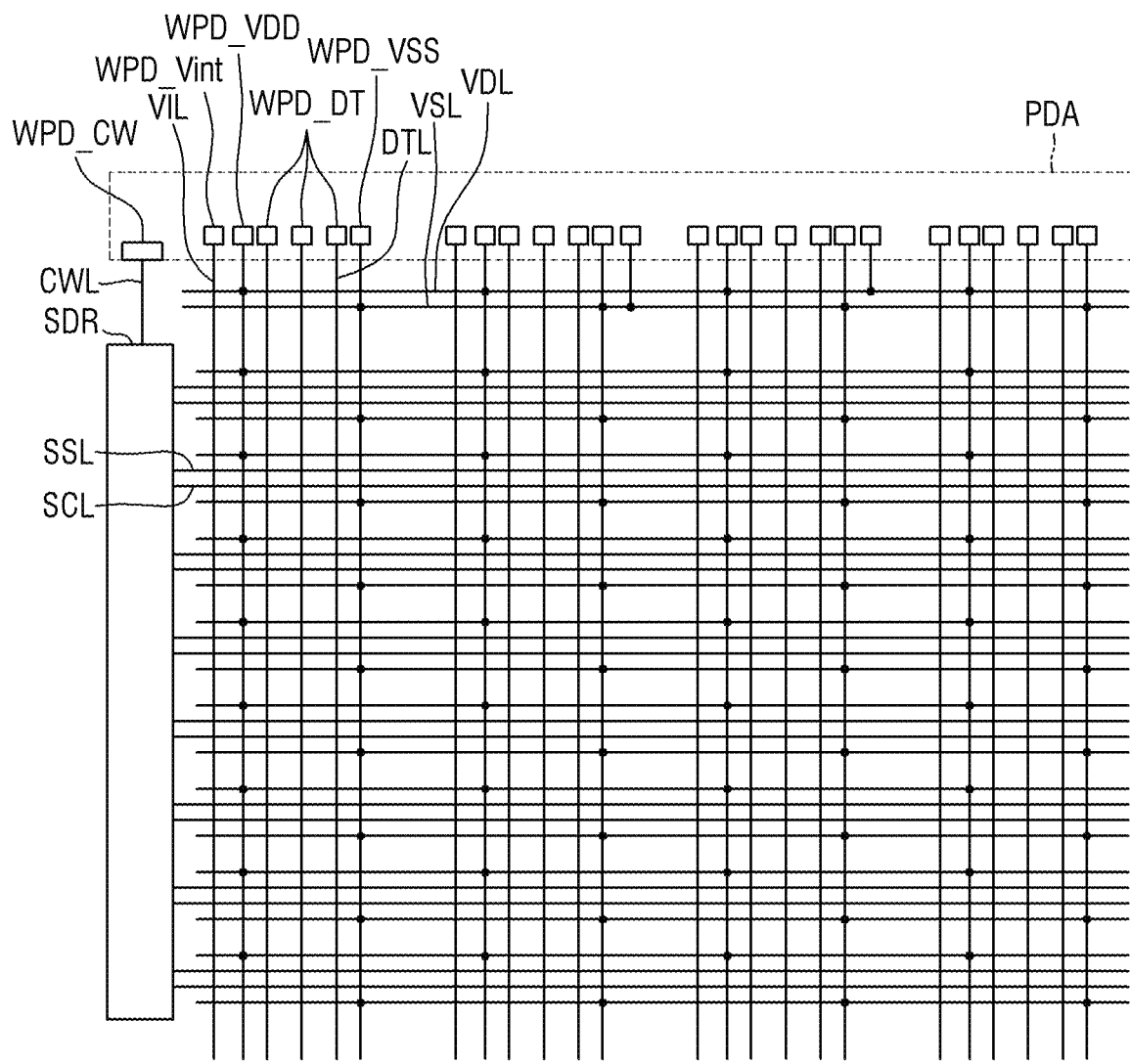
FIG. 2 is a schematic layout illustrating lines included in a display device according to an embodiment.
Figure 2:
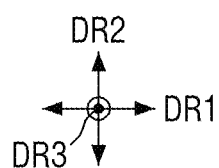

FIG. 2 is a schematic layout illustrating lines included in a display device according to an embodiment.

Referring to FIG. 2, a display device 10 may include lines. The lines may include a scan line SCL, a sensing line SSL, a data line DTL, an initialization voltage line VIL, a first voltage line VDL, a second voltage line VSL, or the like. Although not shown in the drawing, other lines may be further disposed in the display device 10.

The scan line SCL and the sensing line SSL may extend in a first direction DR1. The scan line SCL and the sensing line SSL may be electrically connected to a scan driver SDR. The scan driver SDR may include a driving circuit. The scan driver SDR may be disposed at a side of a display area DPA in the first direction DR1, but the disclosure is not limited thereto. The scan driver SDR may be electrically connected to a signal connection pattern CWL, and at least one end portion of the signal connection pattern CWL may form a line pad WPD_CW in a non-display area NDA to be electrically connected to an external device.

In the specification, the term "connection" may mean that a member is connected to another member through physical contact with the another member as well as meaning that the member is connected to the another member through still another member. In addition, it may be understood that the member and the another member are integral with each other. Furthermore, the connection between the member and the another member may be interpreted as including an electrical connection through still another member in addition to a direct contact connection.

The data line DTL and the initialization voltage line VIL may extend in a second direction DR2 intersecting the first direction DR1. The first voltage line VDL and the second voltage line VSL are disposed to extend in the first direction DR1 and the second direction DR2. As will be described below, the first voltage line VDL and the second voltage line VSL may be formed of conductive layers in which a portion thereof extending in the first direction DR1 and a portion thereof extending in the second direction DR2 are disposed on different layers. The first voltage line VDL and the second voltage line VSL may have a mesh structure in an entire surface of the display area DPA. However, the disclosure is not limited thereto. Each of pixels PX of the display device 10 may be electrically connected to at least one data line DTL, the initialization voltage line VIL, the first voltage line VDL, and the second voltage line VSL.

The data line DTL, the initialization voltage line VIL, the first voltage line VDL, and the second voltage line VSL may be electrically connected to one or more line pads WPD. Each line pad WPD may be disposed in the non-display area NDA. In an embodiment, a line pad WPD_DT (hereinafter referred to as "data pad") of the data line DTL, a line pad WPD_Vint (hereinafter referred to as "initialization voltage pad") of the initialization voltage line VIL, a line pad WPD_VDD (hereinafter referred to as "first voltage pad") of the first voltage line VDL, and a line pad WPD_VSS (hereinafter referred to as "second voltage pad") of the second voltage line VSL may be disposed in a pad area PDA at a side of the display area DPA in the second direction DR2. The external device may be mounted on the line pad WPD. The external device may be mounted on the line pad WPD by an anisotropic conductive film, ultrasonic bonding, or the like.

Each pixel PX or each subpixel PXn of the display device 10 may include a pixel driving circuit (where n is an integer from one to three). The above-described lines may apply a driving signal to each pixel driving circuit by passing through or around each pixel PX. The pixel driving circuit may include transistors and capacitors. The numbers of the transistors and the capacitors of each pixel driving circuit may be variously modified. According to an embodiment, each subpixel PXn of the display device 10 may have a 3T1C structure in which the pixel driving circuit includes three transistors and a capacitor. Hereinafter, a pixel driving circuit having a 3T1C structure will be described as an example, but the disclosure is not limited thereto. Various other modified structures of the pixel PX such as a 2T1C structure, a 7T1C structure, and a 6T1C structure may be applied.

Figure 3:
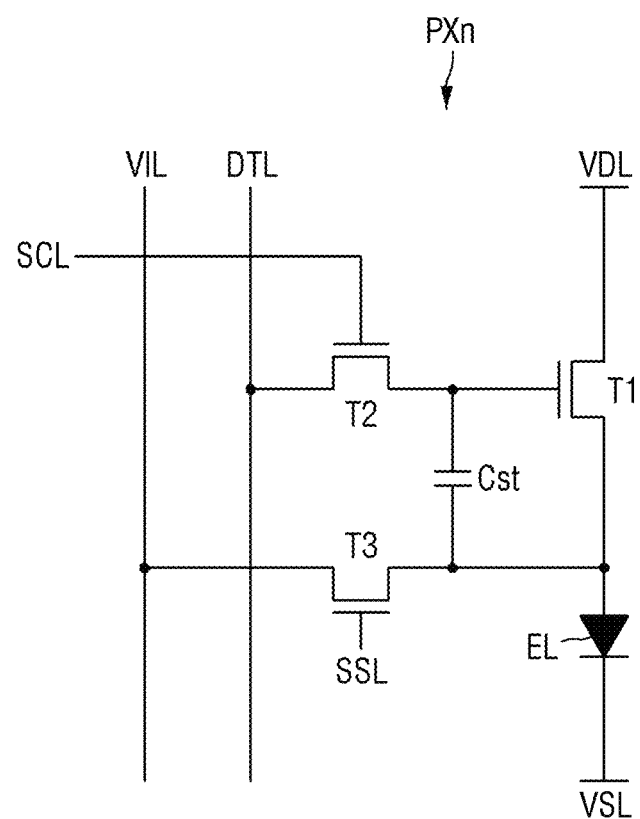
FIG. 3 is an equivalent circuit diagram of a pixel according to an embodiment.

FIG. 3 is a schematic diagram of an equivalent circuit of a pixel according to an embodiment.

Referring to FIG. 3, each subpixel PXn of a display device 10 according to an embodiment includes three transistors T1, T2, and T3 and a storage capacitor Cst in addition to a light-emitting diode EL.

The light-emitting diode EL emits light according to a current supplied through a first transistor T1. The light-emitting diode EL includes a first electrode, a second electrode, and one or more light-emitting elements disposed therebetween. The light-emitting element may emit light having a specific wavelength in response to an electrical signal transmitted from the first electrode and the second electrode.

An end portion of the light-emitting diode EL may be electrically connected to a source electrode of the first transistor T1, and another end portion thereof may be electrically connected to a second voltage line VSL to which a low-potential voltage (hereinafter referred to as a second power voltage) lower than a high potential voltage (hereinafter referred to as a first power voltage) of a first voltage line VDL is supplied. The other end portion of the light-emitting diode EL may be electrically connected to a source electrode of a second transistor T2.

The first transistor T1 adjusts a current flowing to the light-emitting diode EL from the first voltage line VDL, to which the first power voltage is supplied, according to a voltage difference between a gate electrode and the source electrode thereof. As an example, the first transistor T1 may be a driving transistor for driving the light-emitting diode EL. The gate electrode of the first transistor T1 may be electrically connected to the source electrode of the second transistor T2, the source electrode thereof may be electrically connected to the first electrode of the light-emitting diode EL, and a drain electrode thereof may be electrically connected to the first voltage line VDL to which the first power voltage is applied.

The second transistor T2 is turned on in response to a scan signal of a scan line SCL to electrically connect a data line DTL to the gate electrode of the first transistor T1. A gate electrode of the second transistor T2 may be electrically connected to the scan line SCL, the source electrode thereof may be electrically connected to the gate electrode of the first transistor T1, and a drain electrode thereof may be electrically connected to the data line DTL.

A third transistor T3 is turned on in response to a sensing signal of a sensing line SSL to electrically connect an initialization voltage line VIL to one end portion of the light-emitting diode EL. A gate electrode of the third transistor T3 may be electrically connected to the sensing line SSL, a drain electrode thereof may be electrically connected to the initialization voltage line VIL, and a source electrode thereof may be electrically connected to one end portion of the light-emitting diode EL or the source electrode of the first transistor T1.

In an embodiment, the source electrode and the drain electrode of each of the transistors T1, T2, and T3 are not limited to those described above, and the reverse may well be the case. Each of the first to third transistors T1, T2, and T3 may be formed as a thin-film transistor. FIG. 3 illustrates that each of the transistors T1, T2, and T3 is formed as an N-type metal oxide semiconductor field effect transistor (MOSFET), but the disclosure is not limited thereto. For example, each of the transistors T1, T2, and T3 may be formed as a P-type MOSFET, or some thereof may be N-type MOSFETs, and others may be formed as P-type MOSFETs.

The storage capacitor Cst is formed between the gate electrode and the source electrode of the first transistor T1. The storage capacitor Cst stores a differential voltage between a gate voltage and a source voltage of the first transistor T1.

Hereinafter, a structure of a pixel PX of a display device 10 according to an embodiment will be described in detail with reference to other drawings.

Figure 4:
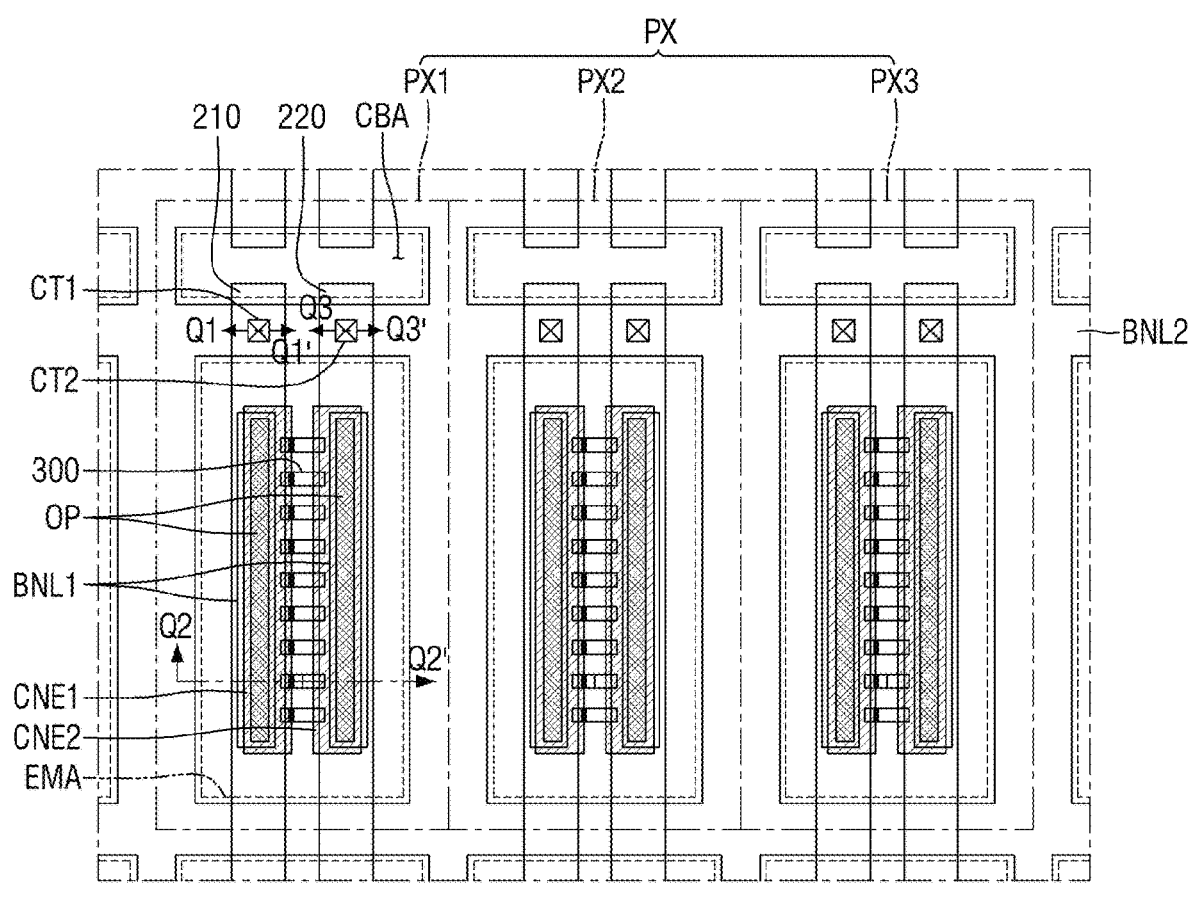
FIG. 4 is a schematic plan view illustrating a pixel of a display device according to an embodiment.
Figure 4:
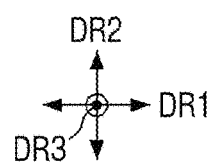

FIG. 4 is a schematic plan view illustrating a pixel of a display device according to an embodiment.

Referring to FIG. 4, each of pixels PX may include subpixels PXn (where n is an integer from one to three). For example, a pixel PX may include a first subpixel PX1, a second subpixel PX2, and a third subpixel PX3. The first subpixel PX1 may emit light having a first color, the second subpixel PX2 may emit light having a second color, and the third subpixel PX3 may emit light having a third color. As an example, the first color may be a blue color, the second color may be a green color, and the third color may be a red color. However, the disclosure is not limited thereto, and the subpixels PXn may emit light having the same color. Although FIG. 4 illustrates that the pixel PX includes three subpixels PXn, the disclosure is not limited thereto, and the pixel PX may include more subpixels PXn.

Each of the subpixels PXn of a display device 10 may include an emission area EMA and a non-emission area (not shown). The emission area EMA may be an area in which light-emitting elements 300 are disposed so that light having a specific wavelength is emitted, and the non-emission area may be an area in which the light-emitting elements 300 are not disposed and light emitted by the light-emitting elements 300 does not arrive so that light is not emitted. The emission area EMA may include an area in which the light-emitting element 300 is disposed and may also include an area adjacent to the light-emitting element 300, for example, an area in which light emitted from the light-emitting element 300 is emitted.

The disclosure is not limited thereto, and the emission area EMA may also include an area in which light emitted from the light-emitting element 300 is reflected or refracted by other members and emitted. The light-emitting elements 300 may be disposed in each subpixel PXn, and the area in which the light-emitting elements 300 are disposed and the area adjacent to the light-emitting elements 300 may be combined to form the emission area EMA.

Each subpixel PXn may include a cutout area CBA disposed in the non-emission area. The cutout area CBA may be disposed at a side of the emission area EMA in a second direction DR2. The cutout area CBA may be disposed between the emission areas EMA of the adjacent subpixels PXn in the second direction DR2. For example, emission areas EMA and cutout areas CBA may be arranged in a display area DPA of the display device 10. For example, the emission areas EMA and the cutout areas CBA may be repeatedly arranged in a first direction DR1, and the emission area EMA and the cutout area CBA may be alternately arranged in the second direction DR2. A spacing interval between the cutout areas CBA in the first direction DR1 may be smaller than a spacing interval between the emission areas EMA in the first direction DR1. A second pattern BNL2 may be disposed between the cutout areas CBA and the emission areas EMA, and an interval therebetween may vary according to a width of the second pattern BNL2. Since the light-emitting element 300 is not disposed in the cutout area CBA, light is not emitted through the cutout areas CBA, but portions of electrodes 210 and 220 disposed in each subpixel PXn may be disposed in the cutout area CBA. The electrodes 210 and 220 disposed in each subpixel PXn may be disposed to be separated in the cutout area CBA.

Figure 5:
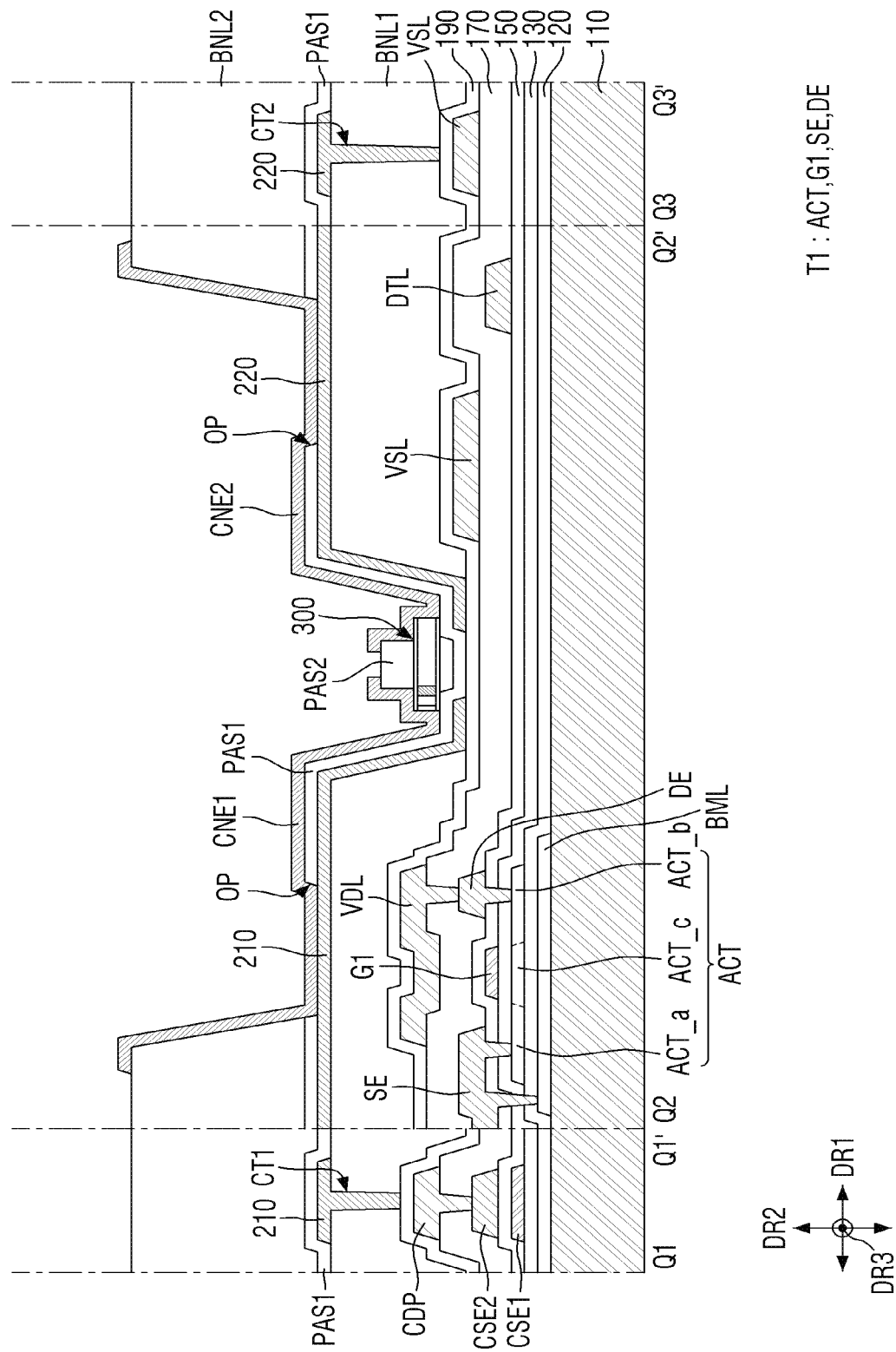
FIG. 5 shows a schematic cross-sectional view taken along lines Q1-Q1', Q2-Q2', and Q3-Q3' of FIG. 4.

FIG. 5 illustrates a schematic cross-sectional view taken along lines Q1-Q1', Q2-Q2', and Q3-Q3' of FIG. 4. FIG. 5 illustrates a schematic cross section traversing both end portions of the light-emitting element 300 disposed in the first subpixel PX1.

Referring to FIGS. 4 and 5, the display device 10 may include a substrate 110 and a semiconductor layer, conductive layers, and insulating layers which are disposed on the substrate 110. The semiconductor layer, the conductive layers, and the insulating layers may constitute a circuit layer and a light-emitting element layer of the display device 10.

A light blocking layer BML may be disposed on the substrate 110. The light blocking layer BML may be disposed to overlap an active layer ACT of a first transistor T1 of the display device 10. The light blocking layer BML may include a material that blocks light, thereby preventing light from being incident on the active layer ACT1 of the first transistor T1. For example, the light blocking layer BML may be made of an opaque metal material that blocks light transmission. However, the disclosure is not limited thereto, and in some embodiments, the light blocking layer BML may be omitted. The light blocking layer BML may be electrically connected to a source electrode SE to function to suppress a change in voltage of the transistor. Furthermore, the light blocking layer BML may be used as lines such as power lines, data lines, or gate lines.

A buffer layer 120 may be disposed on the entirety of the substrate 110 on which the light blocking layer BML is disposed. The buffer layer 120 may be formed on the substrate 110 to protect the first transistor T1 of the pixel PX from moisture permeating through the substrate 110 that is vulnerable to moisture permeation. The buffer layer 120 may perform a surface planarization function. The buffer layer 120 may be provided as inorganic layers that are alternately stacked. For example, the buffer layer 120 may be formed as a multi-layer in which organic layers, which include at least one selected from among silicon oxide ($SiO_x$), silicon nitride ($SiN_x$), silicon oxynitride ($SiO_xN_y$), aluminum oxide ($Al_xO_y$), zirconium oxide ($ZrO_x$), and aluminum nitride (AlN), are alternately stacked.

The semiconductor layer may be disposed on the buffer layer 120. The semiconductor layer may include the active layer ACT of the first transistor T1. The semiconductor layer and the active layer ACT may be disposed to partially overlap a gate electrode G1 or the like of a first conductive layer to be described below.

FIG. 5 illustrates only the first transistor T1 among transistors included in the subpixel PXn of the display device 10, but the disclosure is not limited thereto. The display device 10 may include more transistors. For example, in addition to the first transistor T1, the display device 10 may further include one or more transistors to include two or three transistors for each subpixel PXn.

The semiconductor layer may include polycrystalline silicon, monocrystalline silicon, an oxide semiconductor, or the like. In case that the semiconductor layer includes an oxide semiconductor, each active layer ACT may include conductive regions ACT_a and ACT_b and a channel region ACT_c therebetween. The oxide semiconductor may include indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO), or the like.

In an embodiment, the semiconductor layer may include polycrystalline silicon. Polycrystalline silicon may be formed by crystallizing amorphous silicon. In this case, the conductive regions of the active layer ACT may be doped regions that are doped with impurities.

A first gate insulating layer 130 may be disposed on the semiconductor layer and the buffer layer 120. The first gate insulating layer 130 may include the semiconductor layer and be disposed on the buffer layer 120. The first gate insulating layer 130 may function as a gate insulating layer of each of the transistors. For example, the first gate insulating layer 130 may be formed as an inorganic material, for example, an inorganic layer including at least one selected from among silicon oxide ($SiO_x$), silicon nitride ($SiN_x$), silicon oxynitride ($SiO_xN_y$), aluminum oxide ($Al_xO_y$), zirconium oxide ($ZrO_x$), and aluminum nitride (AlN) or may be formed in a structure in which the inorganic layers are stacked.

The first conductive layer may be disposed on the first gate insulating layer 130. The first conductive layer may include the gate electrode G1 of the first transistor T1 and a first capacitance electrode CSE1 of a storage capacitor. The gate electrode G1 may be disposed to overlap the channel region ACT_c of the active layer ACT in a thickness direction thereof. The first capacitance electrode CSE1 may be disposed to overlap a second capacitance electrode CSE2 to be described below in a thickness direction thereof. In an embodiment, the first capacitance electrode CSE1 may be electrically connected to and be integral with the gate electrode G1. The first capacitance electrode CSE1 may be disposed to overlap the second capacitance electrode CSE2 in the thickness direction, and the storage capacitor may be formed therebetween.

The first conductive layer may be formed as a single layer or a multi-layer made of (or including) one selected from among molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A first interlayer insulating layer 150 may be disposed on the first conductive layer. The first interlayer insulating layer 150 may function as an insulating film between the first conductive layer and other layers disposed thereon. The first interlayer insulating layer 150 may be disposed to cover (or overlap) the first conductive layer and may perform a function of protecting the first conductive layer. For example, the first interlayer insulating layer 150 may be formed as an inorganic layer including at least one selected from among silicon oxide ($SiO_x$), silicon nitride ($SiN_x$), silicon oxynitride ($SiO_xN_y$), aluminum oxide ($Al_xO_y$), zirconium oxide ($ZrO_x$), and aluminum nitride (AlN) or may be formed in a structure in which the inorganic layers are stacked.

A second conductive layer may be disposed on the first interlayer insulating layer 150. The second conductive layer may include the source electrode SE and a drain electrode DE of the first transistor T1, a data line DTL, and the second capacitance electrode CSE2.

The source electrode SE and the drain electrode DE of the first transistor T1 may contact the doped regions ACT_a and ACT_b of the active layer ACT through contact holes passing through the first interlayer insulating layer 150 and the first gate insulating layer 130, respectively. The source electrode SE of the first transistor T1 may contact the light blocking layer BML through another contact hole.

The data line DTL may apply a data signal to other transistors (not shown) included in the display device 10. Although not shown in the drawing, the data line DTL may be electrically connected to source/drain electrodes of other transistors to transmit signals applied to the data line DTL.

The second capacitance electrode CSE2 may be disposed to overlap the first capacitance electrode CSE1 in a thickness direction thereof. In an embodiment, the second capacitance electrode CSE2 may be electrically connected to and be integral with the source electrode SE.

The second conductive layer may be formed as a single layer or a multi-layer made of (or including) one selected from among molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A second interlayer insulating layer 170 may be disposed on the second conductive layer. The second interlayer insulating layer 170 may function as an insulating film between the second conductive layer and other layers disposed thereon. The second interlayer insulating layer 170 may cover (or overlap) the second conductive layer and may perform a function of protecting the second conductive layer. For example, the second interlayer insulating layer 170 may be formed as an inorganic layer including at least one selected from among silicon oxide ($SiO_x$), silicon nitride ($SiN_x$), silicon oxynitride ($SiO_xN_y$), aluminum oxide ($Al_xO_y$), zirconium oxide ($ZrO_x$), and aluminum nitride (AlN) or may be formed in a structure in which the inorganic layers are stacked.

A third conductive layer may be disposed on the second interlayer insulating layer 170. The third conductive layer may include a first voltage line VDL, a second voltage line VSL, and a first conductive pattern CDP. A high-potential voltage (or a first power voltage) to be supplied to the first transistor T1 may be applied to the first voltage line VDL, and a low-potential voltage (or a second power voltage) to be supplied to a second electrode 220 may be applied to the second voltage line VSL. An arrangement signal required to arrange the light-emitting elements 300 may be applied to the second voltage line VSL in a manufacturing process of the display device 10.

The first conductive pattern CDP may be electrically connected to the second capacitance electrode CSE2 through a contact hole formed in the second interlayer insulating layer 170. The second capacitance electrode CSE2 may be integral with the source electrode SE of the first transistor T1, and the first conductive pattern CDP may be electrically connected to the source electrode SE. The first conductive pattern CDP may also contact a first electrode 210 to be described below, and the first transistor T1 may transmit the first power voltage applied from the first voltage line VDL to the first electrode 210 through the first conductive pattern CDP. FIG. 5 illustrates that the third conductive layer includes a second voltage line VSL and a first voltage line VDL, but the disclosure is not limited thereto. The third conductive layer may include additional first voltage lines VDL and additional second voltage lines VSL. However, the disclosure is not limited thereto, and the second conductive layer may function to transmit a signal such as a power voltage or the like. In this case, the third conductive layer may be omitted.

The third conductive layer may be formed as a single layer or a multi-layer made of (or including) one selected from among molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A third interlayer insulating layer 190 may be disposed on the third conductive layer. The third interlayer insulating layer 190 may function as an insulating film between the third conductive layer and other layers disposed thereon. The third interlayer insulating layer 190 may cover (or overlap) the third conductive layer and may perform a function of protecting the third conductive layer. For example, the third interlayer insulating layer 190 may be formed as an inorganic layer including at least one selected from among silicon oxide ($SiO_x$), silicon nitride ($SiN_x$), silicon oxynitride ($SiO_xN_y$), aluminum oxide ($Al_xO_y$), zirconium oxide ($ZrO_x$), and aluminum nitride (AlN) or may be formed in a structure in which the inorganic layers are stacked.

First patterns BNL1, the electrodes 210 and 220, the light-emitting elements 300, connection electrodes CNE1 and CNE2, and the second pattern BNL2 may be disposed on the third interlayer insulating layer 190. Insulating layers PAS1 and PAS2 may be disposed on the third interlayer insulating layer 190.

The first patterns BNL1 may be disposed directly on the third interlayer insulating layer 190. The first patterns BNL1 may extend in the second direction DR2 in each subpixel PXn, may extend to another adjacent subpixel PXn in the second direction DR2, and may be disposed in the emission area EMA. The first patterns BNL1 may be disposed to be spaced apart from each other in the first direction DR1, and the light-emitting element 300 may be disposed therebetween. The first patterns BNL1 may be disposed for each subpixel PXn to form a linear pattern in the display area DPA of the display device 10. FIG. 4 illustrates two first patterns BNL1, but the disclosure is not limited thereto. Additional first patterns BNL1 may be disposed according to the numbers of the electrodes 210 and 220.

The first pattern BNL1 may have a structure in which at least a portion thereof protrudes from an upper surface of the third interlayer insulating layer 190. The protruding portion of the first pattern BNL1 may have an inclined side surface, and light emitted from the light-emitting element 300 may be reflected from the electrodes 210 and 220 disposed on the first patterns BNL1 and may be emitted in an upward direction of the third interlayer insulating layer 190. The first pattern BNL1 may provide an area in which the light-emitting element 300 is disposed and may function as a reflective partition wall that reflects light emitted from the light-emitting element 300 upward. A side surface of the first pattern BNL1 may be inclined in a linear shape, but the disclosure is not limited thereto. The first pattern BNL1 may have an outer surface that has a curved semi-circular or semi-elliptical shape. The first patterns BNL1 may include an organic insulating material such as polyimide (PI), but the disclosure is not limited thereto.

The electrodes 210 and 220 may be disposed on the first patterns BNL1 and the third interlayer insulating layer 190. The electrodes 210 and 220 may include the first electrode 210 and the second electrode 220. The first electrode 210 and the second electrode 220 may extend in the second direction DR2 and may be disposed to be spaced apart from each other in the first direction DR1.

The first electrode 210 and the second electrode 220 may each extend in the second direction DR2 in the subpixel PXn and may be separated from other electrodes 210 and 220 in the cutout area CBA. For example, the cutout area CBA may be disposed between the emission areas EMA of the adjacent subpixels PXn in the second direction DR2. In the cutout area CBA, the first electrode 210 and the second electrode 220 may be separated from other first and second electrodes 210 and 220 disposed in the adjacent subpixel PXn in the second direction DR2. However, the disclosure is not limited thereto, and some of the electrodes 210 and 220 may not be separated for each subpixel PXn and may be disposed to extend beyond the adjacent subpixel PXn in the second direction DR2, or only one of the first electrode 210 or the second electrode 220 may be separated for each subpixel PXn.

The first electrode 210 may be electrically connected to the first transistor T1 through a first electrode contact hole CT1, and the second electrode 220 may be electrically connected to the second voltage line VSL through a second electrode contact hole CT2. For example, the first electrode 210 may contact the first conductive pattern CDP through the first electrode contact hole CT1 passing through the third interlayer insulating layer 190 at a portion of the second pattern BNL2 extending in the first direction DR1. The second electrode 220 may also contact the second voltage line VSL through the second electrode contact hole CT2 passing through the third interlayer insulating layer 190 at the portion of the second pattern BNL2 extending in the first direction DR1. However, the disclosure is not limited thereto. In an embodiment, the first electrode contact hole CT1 and the second electrode contact hole CT2 may be disposed in the emission area EMA surrounded by the second pattern BNL2 so as to not overlap the second pattern BNL2. In an embodiment, the second electrode 220 may directly contact a first data line layer so that a voltage may be applied thereto.

Although FIG. 4 illustrates that a first electrode 210 and a second electrode 220 are disposed for each subpixel PXn, the disclosure is not limited thereto, and additional first and second electrodes 210 and 220 may be disposed for each subpixel PX. The first electrode 210 and the second electrode 220 disposed in each subpixel PXn may not necessarily extend in a direction, and the first electrode 210 and the second electrode 220 may be arranged in various structures. For example, the first electrode 210 and the second electrode 220 may have a partially curved or bent shape, and an electrode may be disposed to surround another electrode.

The first electrode 210 and the second electrode 220 may each be disposed directly on the first pattern BNL1. Each of the first electrode 210 and the second electrode 220 may be formed to have a width that is greater than that of the first pattern BNL1. For example, the first electrode 210 and the second electrode 220 may each be disposed to cover (or overlap) the outer surface of the first pattern BNL1. The first electrode 210 and the second electrode 220 may each be disposed on the side surface of the first pattern BNL1, and an interval between the first electrode 210 and the second electrode 220 may be smaller than an interval between the first patterns BNL1. At least portions of the first electrode 210 and the second electrode 220 may be disposed directly on the third interlayer insulating layer 190 and disposed to be coplanar with each other. However, the disclosure is not limited thereto. In some embodiments, each of the electrodes 210 and 220 may have the width that is smaller than that of the first pattern BNL1. However, each of the electrodes 210 and 220 may be disposed to at least cover (or overlap) a side surface of the first pattern BNL1 to reflect light emitted from the light-emitting element 300.

Each of the electrodes 210 and 220 may include a conductive material having high reflectance. For example, as the conductive material having high reflectance, each of the electrodes 210 and 220 may include a metal such as silver (Ag), copper (Cu), or aluminum (Al), or an alloy including aluminum (Al), nickel (Ni), lanthanum (La), or the like. Each of the electrodes 210 and 220 may reflect light, which is emitted from the light-emitting element 300 and travels toward the side surface of the first pattern BNL1, in an upward direction of each subpixel PXn.

However, the disclosure is not limited thereto, and each of the electrodes 210 and 220 may further include a transparent conductive material. For example, each of the electrodes 210 and 220 may include a material such as ITO, IZO, or indium tin zinc oxide (ITZO). In some embodiments, each of the electrodes 210 and 220 may have a structure in which each of a transparent conductive material and a metal layer having high reflectance is stacked as one or more layers or may be formed as a layer including the transparent conductive material and the metal layer having high reflectance. For example, each of the electrodes 210 and 220 may have a stacked structure such as ITO/Ag/ITO/, ITO/Ag/IZO, or ITO/Ag/ITZO/IZO.

The electrodes 210 and 220 may be electrically connected to the light-emitting elements 300, and a predetermined voltage may be applied thereto such that the light-emitting elements 300 emit light. The electrodes 210 and 220 may be electrically connected to the light-emitting elements 300 through the connection electrodes CNE1 and CNE2 and may transmit electrical signals, which are applied to the electrodes 210 and 220, to the light-emitting elements 300 through the connection electrodes CNE1 and CNE2.

One of the first electrode 210 and the second electrode 220 may be electrically connected to an anode of the light-emitting element 300, and the other thereof may be electrically connected to a cathode of the light-emitting element 300. However, the disclosure is not limited thereto, and the reverse may well be the case.

Each of the electrodes 210 and 220 may be used to form an electric field in the subpixel PXn in order to arrange the light-emitting elements 300. The light-emitting elements 300 may be disposed between the first electrode 210 and the second electrode 220 by an electric field formed on the first electrode 210 and the second electrode 220. The light-emitting elements 300 of the display device 10 may be sprayed on the electrodes 210 and 220 by an inkjet printing process. In case that an ink including the light-emitting elements 300 is sprayed on the electrodes 210 and 220, an arrangement signal is applied to the electrodes 210 and 220 to generate an electric field. The light-emitting elements 300 dispersed in the ink may be arranged on the electrodes 210 and 220 by receiving a dielectrophoretic force by an electric field generated on the electrodes 210 and 220.

A first insulating layer PAS1 may be disposed on the third interlayer insulating layer 190. The first insulating layer PAS1 may be disposed to cover (or overlap) the first patterns BNL1, the first electrode 210, and the second electrode 220. The first insulating layer PAS1 may protect the first electrode 210 and the second electrode 220 and insulate the first electrode 210 and the second electrode 220 from each other. The first insulating layer PAS1 may prevent the light-emitting element 300, disposed on the first insulating layer PAS1, from being damaged by directly contacting other members.

In an embodiment, the first insulating layer PAS1 may include openings OP partially exposing the first electrode 210 and the second electrode 220. Each opening OP may partially expose a portion of each of the electrodes 210 and 220 disposed on upper surfaces of the first patterns BNL1. Portions of the connection electrodes CNE1 and CNE2 may contact the electrodes 210 and 220 exposed through the openings OP.

A portion of an upper surface of the first insulating layer PAS1 may be recessed to form a stepped portion (or height difference) between the first electrode 210 and the second electrode 220. For example, the first insulating layer PAS1 may be disposed to cover (or overlap) the first electrode 210 and the second electrode 220 so that the upper surface thereof may be stepped according to the shapes of the electrodes 210 and 220 disposed under the first insulating layer PAS1. However, the disclosure is not limited thereto.

The second pattern BNL2 may be disposed on the first insulating layer PAS1. The second pattern BNL2 may include parts extending in the first direction DR1 and the second direction DR2 in a plan view and may be disposed in a grid pattern in an entire surface of the display area DPA. The second pattern BNL2 may be disposed over boundaries of the subpixels PXn to distinguish the adjacent subpixels PXn.

The second pattern BNL2 may be disposed to surround the emission area EMA and the cutout area CBA disposed for each subpixel PXn to distinguish the emission area EMA and the cutout area CBA. The first electrode 210 and the second electrode 220 may extend in the second direction DR2 and may be disposed across the portion of the second pattern BNL2 which extends in the first direction DR1. The portion of the second pattern BNL2 extending in the second direction DR2 and disposed between the emission areas EMA may have a width greater than that of a portion of the second pattern BNL2 disposed between the cutout areas CBA. Therefore, an interval between the cutout areas CBA may be smaller than an interval between the emission areas EMA.

The second pattern BNL2 may be formed to have a height greater than that of the first pattern BNL1. The second pattern BNL2 may prevent inks from overflowing into adjacent subpixels PXn in an inkjet printing process of the manufacturing process of the display device 10, thereby separating the inks, in which different light-emitting elements 300 are dispersed for different subpixels PXn, so as to not be mixed with each other. Similar to the first pattern BNL1, the second pattern BNL2 may include PI, but the disclosure is not limited thereto.

The light-emitting elements 300 may be disposed on the first insulating layer PAS1. The light-emitting elements 300 may be disposed to be spaced apart from each other in the second direction DR2 in which each of the electrodes 210 and 220 extends, and may be arranged substantially parallel to each other. The light-emitting element 300 may extend in a direction, and the extending direction of the light-emitting element 300 may be substantially perpendicular to the extending direction of each of the electrodes 210 and 220. However, the disclosure is not limited thereto, and the light-emitting element 300 may be disposed to be inclined without being perpendicular to the extending direction of each of the electrodes 210 and 220.

The light-emitting elements 300 disposed in each subpixel PXn may include light-emitting layers 360 (see FIG. 6) including different materials to emit light, having different wavelengths, to the outside. Accordingly, the first color light, the second color light, and the third color light may be emitted from the first subpixel PX1, the second subpixel PX2, and the third subpixel PX3, respectively. However, the disclosure is not limited thereto, and each of the subpixels PXn may include the same type of the light-emitting elements 300 to emit substantially the same colored light.

Both end portions of the light-emitting element 300 may be disposed on the electrodes 210 and 220 between the first patterns BNL1. An extended length of the light-emitting element 300 may be greater than the interval between the first electrode 210 and the second electrode 220, and both end portions of the light-emitting element 300 may be disposed on the first electrode 210 and the second electrode 220. For example, the light-emitting element 300 may be disposed such that an end portion thereof is placed on the first electrode 210 and another end portion thereof is placed on the second electrode 220.

In the light-emitting element 300, layers may be disposed in a direction parallel to an upper surface of the substrate 110 or the third interlayer insulating layer 190. The light-emitting element 300 may be disposed such that a direction in which the light-emitting element 300 extends is parallel to the upper surface of the third interlayer insulating layer 190, and semiconductor layers included in the light-emitting element 300 may be sequentially disposed in the direction parallel to the upper surface of the third interlayer insulating layer 190. However, the disclosure is not limited thereto, and in case that the light-emitting element 300 has a different structure, the semiconductor layers may be disposed in a direction perpendicular to the upper surface of the third interlayer insulating layer 190.

Both the end portions of the light-emitting element 300 may contact the connection electrodes CNE1 and CNE2. For example, an insulating film 380 (see FIG. 6) may not be formed on a surface of the end portion of the light-emitting element 300 in a direction in which the light-emitting element 300 extends, and thus, a portion of a first or second semiconductor layer 310 and 320 (see FIG. 6) or an electrode layer 370 (see FIG. 6) may be exposed. The exposed first or second semiconductor layer 310 and 320 (see FIG. 6) or the exposed electrode layer 370 (see FIG. 6) may contact the connection electrode CNE1 or CNE2. However, the disclosure is not limited thereto, and at least a portion of the insulating film 380 may be removed from the light-emitting element 300 to partially expose side surfaces of both end portions of the first and second semiconductor layers 310 and 320 (see of FIG. 6). The exposed side surfaces of the first and second semiconductor layers 310 and 320 (see FIG. 6) may directly contact the connection electrodes CNE1 and CNE2.

A second insulating layer PAS2 may be disposed on a portion of the light-emitting element 300. For example, the second insulating layer PAS2 may have a width smaller than a length of the light-emitting element 300 and may be disposed on the light-emitting element 300 to surround the light-emitting element 300 such that both end portions of the light-emitting elements 300 are exposed. In the manufacturing process of the display device 10, the second insulating layer PAS2 may be disposed to cover (or overlap) the light-emitting element 300, the electrodes 210 and 220, and the first insulating layer PAS1 and then removed to expose both end portions of the light-emitting element 300. The second insulating layer PAS2 may be disposed on the first insulating layer PAS1 to extend in the second direction DR2 in a plan view, thereby forming a linear or island-shaped pattern in each subpixel PXn. The second insulating layer PAS2 may protect the light-emitting element 300 and affix the light-emitting element 300 in the process of manufacturing the display device 10.

The connection electrodes CNE1 and CNE2 may be disposed on the second insulating layer PAS2. The connection electrodes CNE1 and CNE2 may extend in a direction and may be disposed on the electrodes 210 and 220, respectively. The connection electrodes CNE1 and CNE2 may include a first connection electrode CNE1 disposed on the first electrode 210 and a second connection electrode CNE2 disposed on the second electrode 220. The connection electrodes CNE1 and CNE2 may be disposed to be spaced apart from or face each other. For example, the first connection electrode CNE1 and the second connection electrode CNE2 may be respectively disposed on the first electrode 210 and the second electrode 220 and may be spaced apart from each other in the first direction DR1. Each of the connection electrodes CNE1 and CNE2 may form a stripe pattern in the emission area EMA of each subpixel PXn.

Each of the connection electrodes CNE1 and CNE2 may contact the light-emitting element 300. The first connection electrode CNE1 may contact the end portions of the light-emitting elements 300, and the second connection electrode CNE2 may contact the other end portions of the light-emitting elements 300. The semiconductor layers of the light-emitting element 300 may be exposed from surfaces of both the end portions of the light-emitting element 300 in the direction in which the light-emitting element 300 extends, and the connection electrodes CNE1 and CNE2 may contact the semiconductor layers of the light-emitting element 300 to be electrically connected thereto. Sides of the connection electrodes CNE1 and CNE2 contacting both the end portions of the light-emitting element 300 may be disposed on the second insulating layer PAS2. The first connection electrode CNE1 may contact the first electrode 210 through the opening OP exposing a portion of an upper surface of the first electrode 210, and the second connection electrode CNE2 may contact the second electrode 220 through the opening OP exposing a portion of an upper surface of the second electrode 220.

Each of the connection electrodes CNE1 and CNE2 may have a width measured in a direction that is smaller than that of each of the electrodes 210 and 220 measured in the direction. The connection electrodes CNE1 and CNE2 may be disposed so as to contact the end portion and the other end portion of the light-emitting element 300 and cover (or overlap) the portions of the upper surfaces of the first electrode 210 and the second electrode 220, respectively.

However, the disclosure is not limited thereto, and the connection electrodes CNE1 and CNE2 may be formed to have a width greater than that of the electrodes 210 and 220 and to cover both sides of the electrodes 210 and 220.

The connection electrodes CNE1 and CNE2 may include a transparent conductive material. For example, the connection electrodes CNE1 and CNE2 may include ITO, IZO, ITZO, aluminum (Al), or the like. Light emitted by the light-emitting element 300 may pass through the connection electrodes CNE1 and CNE2 and travel toward the electrodes 210 and 220. However, the disclosure is not limited thereto.

FIG. 4 illustrates that two connection electrodes CNE1 and CNE2 are disposed in a subpixel PXn, but the disclosure is not limited thereto. The numbers of the connection electrodes CNE1 and CNE2 may vary according to the number of the electrodes 210 and 220 disposed for each subpixel PXn.

Although not shown in the drawings, a third insulating layer may be further disposed on the connection electrodes CNE1 and CNE2. The third insulating layer may be disposed in the entirety of the display area DPA of the substrate 110. The third insulating layer may perform a function of protecting members disposed on the substrate 110 from an external environment.

Each of the first insulating layer PAS1 and the second insulating layer PAS2 may include an inorganic insulating material or an organic insulating material. For example, the first insulating layer PAS1 and the second insulating layer PAS2 may include an inorganic insulating material such as silicon oxide ($SiO_x$), silicon nitride ($SiN_x$), silicon oxynitride ($SiO_xN_y$), aluminum oxide ($Al_xO_y$), zirconium oxide ($ZrO_x$), or aluminum nitride (AlN). As another example, the first insulating layer PAS1 and the second insulating layer PAS2 may include an organic insulating material such as an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin. However, the disclosure is not limited thereto.

Figure 6:
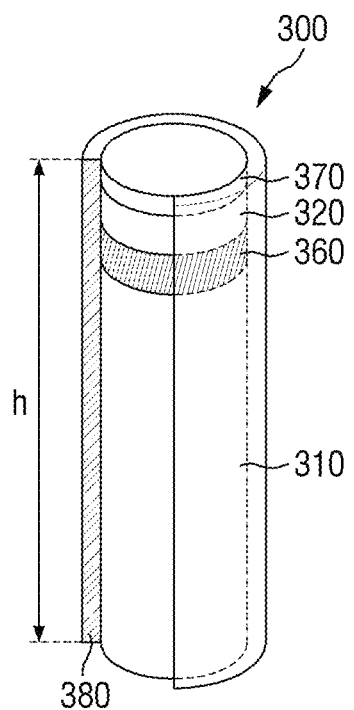
FIG. 6 is a schematic view of a light-emitting element according to an embodiment.

FIG. 6 is a schematic view of the light-emitting element according to an embodiment.

Referring to FIG. 6, the light-emitting element 300 may be a particulate element and may have a rod-like or cylindrical shape having a predetermined aspect ratio. A length h of the light-emitting element 300 may be in a range from a nanometer scale (1 nm or more and less than 1 m) to a micrometer scale (1 m or more and less than 1 mm). In an embodiment, both of a diameter and length of the light-emitting element 300 may have a size of a nanometer scale or a size of a micrometer scale. In some embodiments, the diameter of the light-emitting element 300 may have a size of a nanometer scale, and the length of the light-emitting element 300 may have a size of a micrometer scale. In some embodiments, the diameter and/or length of some light-emitting elements 300 may have a size of a nanometer scale, and the diameter and/or length of other light-emitting elements 300 may have a size of a micrometer scale.

In an embodiment, the light-emitting element 300 may be an inorganic light-emitting diode. Specifically, the light-emitting element 300 may include the semiconductor layers doped with a conductivity-type (for example, p-type or n-type) impurities. The semiconductor layer may emit light at a specific wavelength by receiving an electrical signal applied from an external power source.

The light-emitting element 300 according to an embodiment may include the first semiconductor layer 310, the light-emitting layer 360, the second semiconductor layer 320, and the electrode layer 370 which are sequentially stacked in a length direction of the light-emitting element 300. The light-emitting element may further include the insulating film 380 surrounding outer surfaces of the first semiconductor layer 310, the second semiconductor layer 320, and the light-emitting layer 360.

The first semiconductor layer 310 may be an n-type semiconductor. In case that the light-emitting element 300 emits light having a blue wavelength, the first semiconductor layer 310 may include a semiconductor material having a formula of $Al_xGa_yIn_{1-x-y}N$ ($0 \leq x \leq 1$, $0 \leq y \leq 1$, and $0 \leq x+y \leq 1$). For example, the first semiconductor layer 310 may include at least one selected from among AlGaInN, GaN, AlGaN, InGaN, AlN, and InN which are doped with an n-type dopant. The first semiconductor layer 310 may be doped with an n-type dopant, and the n-type dopant may be silicon (Si), germanium (Ge), tin (Sn), or the like. For example, the first semiconductor layer 310 may include n-GaN doped with n-type Si. The first semiconductor layer 310 may have a length ranging from about 1.5 m to about 5 m, but the disclosure is not limited thereto.

The second semiconductor layer 320 may be disposed on the light-emitting layer 360 to be described below. The second semiconductor layer 320 may be a p-type semiconductor, and in case that the light-emitting element 300 emits light having a blue or green wavelength, the second semiconductor layer 320 may include a semiconductor material having a formula of $Al_xGa_yIn_{1-x-y}N$ ($0 \leq x \leq 1$, $0 \leq y \leq 1$, and $0 \leq x+y \leq 1$). For example, the second semiconductor layer 320 may include at least one selected from among AlGaInN, GaN, AlGaN, InGaN, AlN, and InN which are doped with a p-type dopant. The second semiconductor layer 320 may be doped with a p-type dopant, and the p-type dopant may be magnesium (Mg), zinc (Zn), calcium (Ca), selenium (Se), barium (Ba), or the like. For example, the second semiconductor layer 320 may include p-GaN doped with Mg, which is a p-type dopant. The second semiconductor layer 320 may have a length ranging from about 0.05 m to about 0.10 m, but the disclosure is not limited thereto.

FIG. 6 illustrates that the first semiconductor layer 310 and the second semiconductor layer 320 are formed as a layer, but the disclosure is not limited thereto. The first semiconductor layer 310 and the second semiconductor layer 320 may further include additional layers, for example, a clad layer or a tensile strain barrier reducing (TSBR) layer according to a material of the light-emitting layer 360.

The light-emitting layer 360 may be disposed between the first semiconductor layer 310 and the second semiconductor layer 320. The light-emitting layer 360 may include a material having a single or multi-quantum well structure. In case that the light-emitting layer 360 includes a material having a multi-quantum well structure, the light-emitting layer 360 may have a structure in which quantum layers and well layers are alternately stacked. The light-emitting layer 360 may emit light by combination of electron-hole pairs according to an electrical signal applied through the first semiconductor layer 310 and the second semiconductor layer 320. In case that the light-emitting layer 360 emits light having a blue wavelength, the light-emitting layer 360 may include a material such as AlGaN or AlGaInN. In particular, in case that the light-emitting layer 360 has a structure in which quantum layers and well layers are alternately stacked in a multi-quantum well structure, the quantum layer may include a material such as AlGaN or AlGaInN, and the well layer may include a material such as GaN or AlInN. For example, the light-emitting layer 360 may include AlGaInN as the quantum layer and AlInN as the well layer. Therefore, as described above, the light-emitting layer 360 may emit blue light having a central wavelength ranging from about 450 nm to about 495 nm.

However, the disclosure is not limited thereto, and the light-emitting layer 360 may have a structure in which a semiconductor material having high band gap energy and a semiconductor material having low band gap energy are alternately stacked or may include other Group III or V semiconductor materials according to a wavelength of emitted light. Light emitted from the light-emitting layer 360 is not limited to light having a blue wavelength, and in some embodiments, the light-emitting layer 360 may emit light having a red or green wavelength. The light-emitting layer 360 may have a length ranging from about 0.05 m to about 0.10 m, but the disclosure is not limited thereto.

Light emitted from the light-emitting layer 360 may be emitted not only to an outer surface of the light-emitting element 300 in the length direction thereof but also to both side surfaces of the light-emitting element 300. The directionality of the light emitted from the light-emitting layer 360 is not limited to a direction.

The electrode layer 370 may be an ohmic connection electrode. However, the disclosure is not limited thereto, and the electrode layer 370 may be a Schottky connection electrode. The light-emitting element 300 may include at least one electrode layer 370. FIG. 6 illustrates that the light-emitting element 300 includes an electrode layer 370, but the disclosure is not limited thereto. In some embodiments, the light-emitting element 300 may include additional electrode layers 370, or the electrode layer 370 may be omitted. Even in case that the number of the electrode layers 370 varies or other structures are further included, the same may be applied to the description of the light-emitting element 300 to be described below.

In the display device 10 according to an embodiment, in case that the light-emitting element 300 is electrically connected to an electrode or a connection electrode, the electrode layer 370 may reduce resistance between the light-emitting element 300 and the electrode or the connection electrode. The electrode layer 370 may include a material having conductivity. For example, the electrode layer 370 may include at least one selected from among aluminum (Al), titanium (Ti), indium (In), gold (Au), silver (Ag), ITO, IZO, and ITZO. Furthermore, the electrode layer 370 may include a semiconductor material that is doped with an n- or p-type dopant. The electrode layers 370 may include a same material or different materials, but the disclosure is not limited thereto.

The insulating film 380 may be disposed to surround outer surfaces of the semiconductor layers and the electrode layers described above. For example, the insulating film 380 may be disposed to surround at least the outer surface of the light-emitting layer 360 and may extend in a direction in which the light-emitting element 300 extends. The insulating film 380 may perform a function of protecting such members. The insulating film 380 may be formed to surround side surfaces of the members and may be formed to expose both end portions of the light-emitting element 300 in the length direction thereof.

FIG. 6 illustrates that the insulating film 380 is formed to extend in the length direction of the light-emitting element 300 and to cover (or overlap) the side surfaces from the first semiconductor layer 310 to the electrode layer 370, but the disclosure is not limited thereto. The insulating film 380 may cover only the outer surfaces of some of the semiconductor layers including the light-emitting layer 360 or may cover only a portion of an outer surface of the electrode layer 370 to partially expose the outer surface of the electrode layer 370. The insulating film 380 may have a rounded upper surface in a cross section in an area adjacent to at least one end portion of the light-emitting element 300.

The insulating film 380 may have a thickness ranging from about 10 nm to about 1.0 m, but the disclosure is not limited thereto. The insulating film 380 may have a thickness of about 40 nm.

The insulating film 380 may include at least one selected from among materials having insulating properties, for example, silicon oxide ($SiO_x$), silicon nitride ($SiN_x$), silicon oxynitride ($SiO_xN_y$), aluminum nitride (AlN), and aluminum oxide ($Al_xO_y$). The insulating film 380 may be formed as a single layer or a multi-layer of the materials having insulating properties. Accordingly, it is possible to prevent an electrical short circuit that may occur in case that the light-emitting layer 360 directly contacts an electrode through which an electrical signal is transmitted to the light-emitting element 300. Since the insulating film 380 protects the outer surface of the light-emitting element 300 including the light-emitting layer 360, it is possible to prevent a decrease in luminous efficiency.

An outer surface of the insulating film 380 may be surface-treated. The light-emitting element 300 may be sprayed and arranged on an electrode in a state of being dispersed in a certain ink. Here, in order for the light-emitting element 300 to remain dispersed without being aggregated with other adjacent light-emitting elements 300 in the ink, the surface of the insulating film 380 may be treated to be hydrophobic or hydrophilic. For example, the outer surface of the insulating film 380 may be surface-treated with a material such as a stearic acid or a 2,3-naphthalene dicarboxylic acid.

Figure 7:
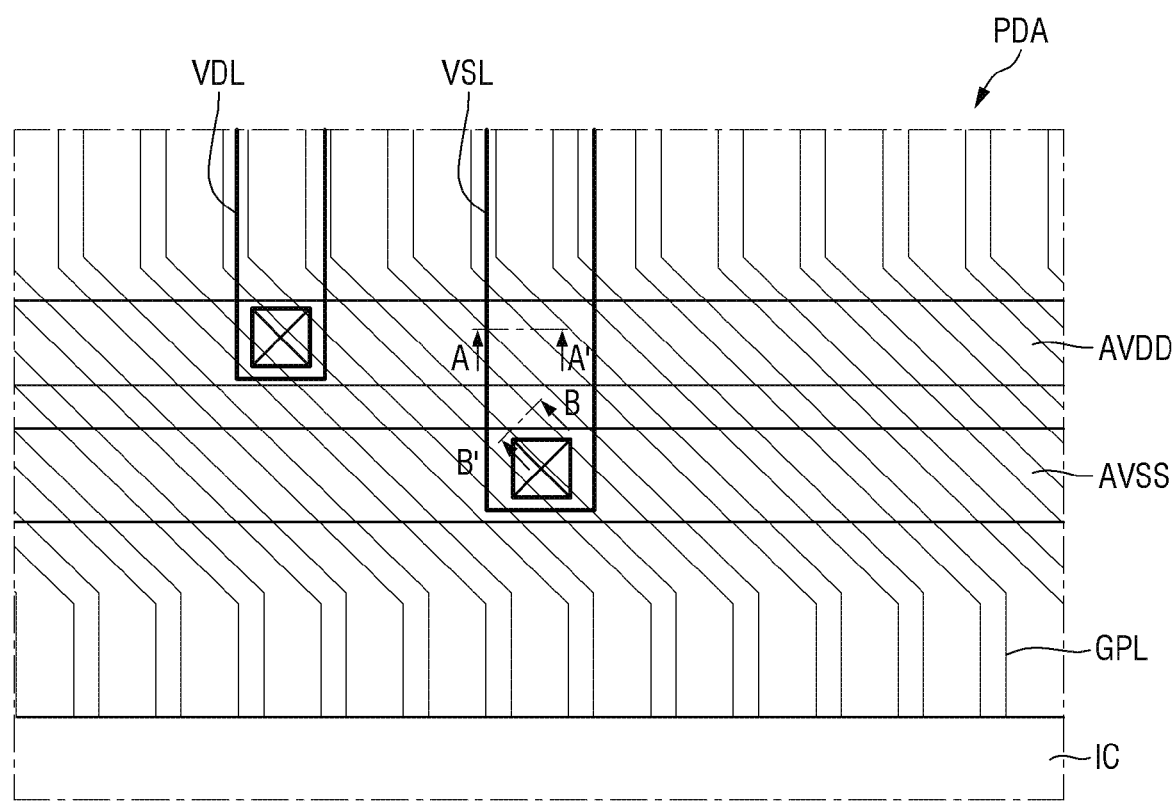
FIG. 7 is a schematic plan view illustrating a pad area of a display device according to an embodiment.
Figure 7:
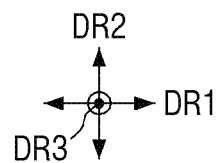
Figure 8:
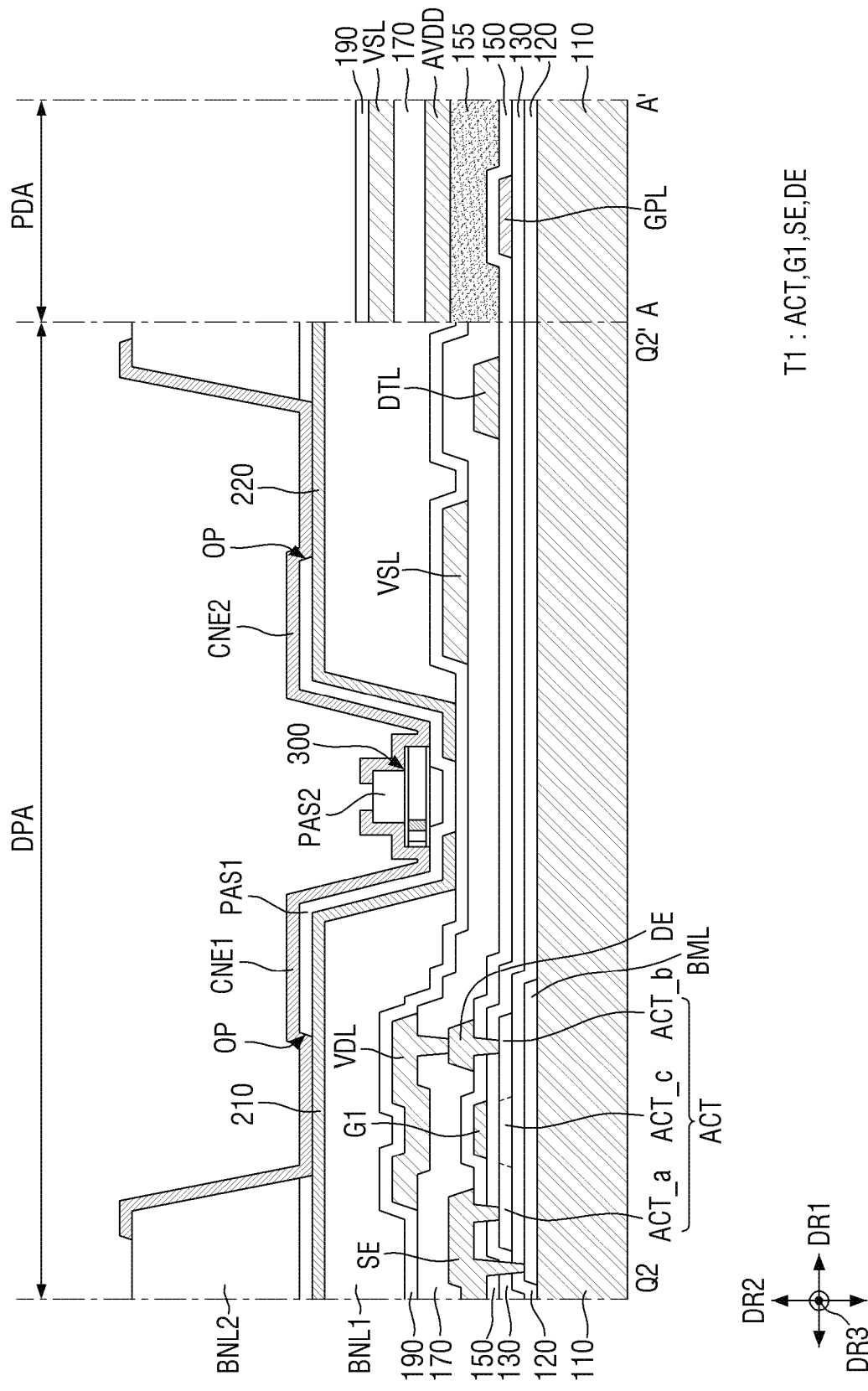
FIG. 8 shows a schematic cross-sectional view taken along line Q2-Q2' of FIG. 4 and line A-A' of FIG. 7.
Figure 9:
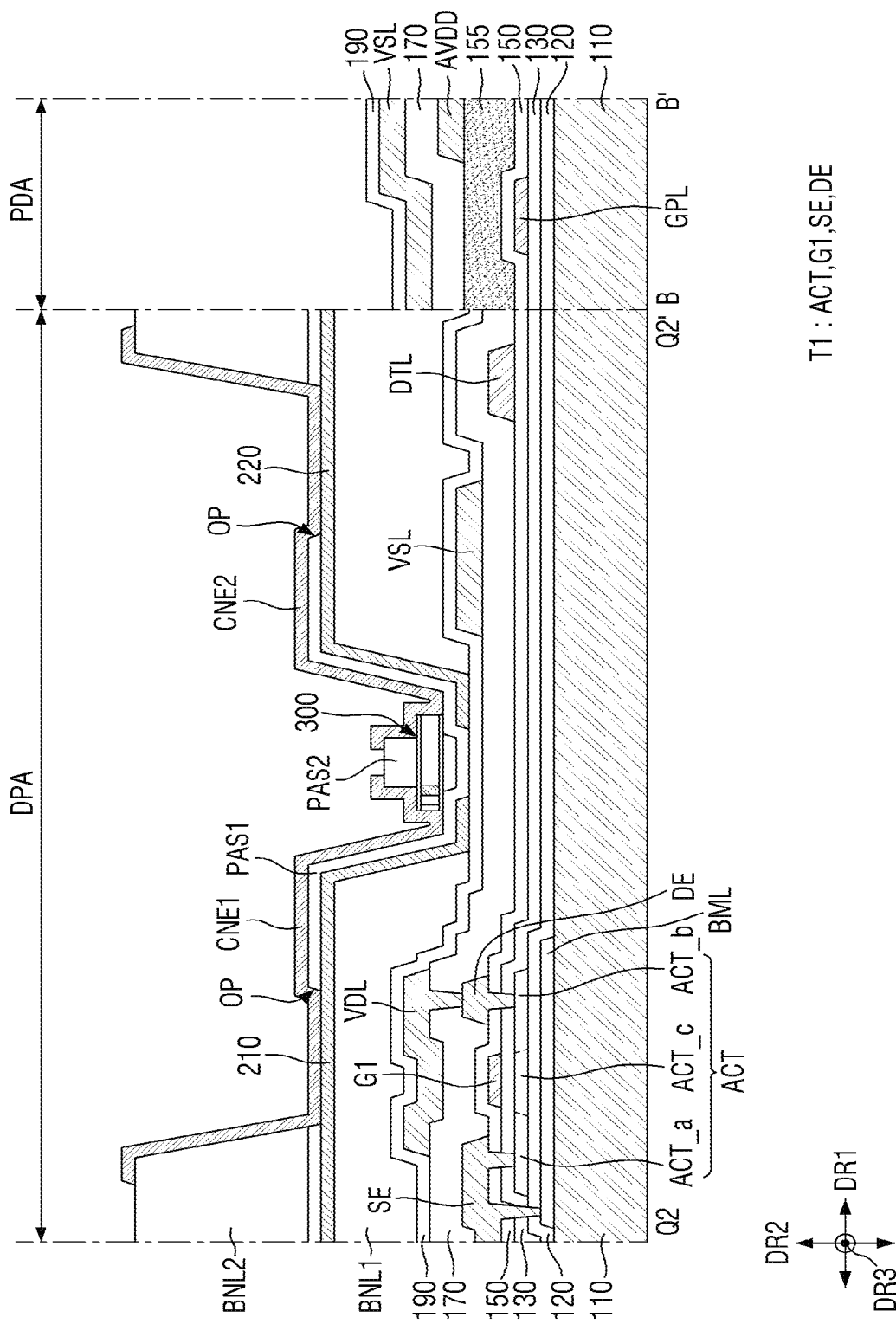
FIG. 9 shows a schematic cross-sectional view taken along line Q2-Q2' of FIG. 4 and line B-B' of FIG. 7.

FIG. 7 is a schematic plan view illustrating a pad area of a display device according to an embodiment. FIG. 8 illustrates cross-sectional views taken along line Q2-Q2' of FIG. 4 and line A-A' of FIG. 7. FIG. 9 illustrates cross-sectional views taken along line Q2-Q2' of FIG. 4 and line B-B' of FIG. 7. Hereinafter, since cross sections taken along line Q2-Q2' of FIG. 4 shown in FIGS. 8 and 9 have been described in detail with reference to FIG. 5, descriptions thereof will be briefly given.

Referring to FIG. 7, a display device 10 according to an embodiment may include a pad area PDA disposed outside a display area and may include lines and driving integrated circuits IC disposed in the pad area PDA. The number of the driving integrated circuits IC disposed in the pad area PDA may be variously adjusted according to the resolution of the display device 10.

The lines may include a first voltage line VDL, a second voltage line VSL, first fan-out lines GPL, a first auxiliary line AVDD, and a second auxiliary line AVSS. The first voltage line VDL, the second voltage line VSL, the first fan-out line GPL, the first auxiliary line AVDD, and the second auxiliary line AVSS may be electrically connected to the driving integrated circuit IC in the pad area PDA.

The first voltage line VDL may extend in a second direction DR and may be disposed to extend from the display area to the pad area PDA. The first voltage line VDL may be formed of a third conductive layer in the display area and may extend to the pad area PDA. The first voltage line VDL may be electrically connected to the driving integrated circuit IC by being electrically connected to the first auxiliary line AVDD in the pad area PDA.

The second voltage line VSL may extend in the second direction DR2 and may be disposed to extend from the display area to the pad area PDA. The second voltage line VSL may be disposed to be spaced apart from the first voltage line VDL in a first direction DR1. The second voltage line VSL may be formed of the third conductive layer in the display area and may extend to the pad area PDA. The second voltage line VSL may be electrically connected to the driving integrated circuit IC by being electrically connected to the second auxiliary line AVSS in the pad area PDA.

The first fan-out line GPL may extend substantially in the second direction DR2 and may be electrically connected to the driving integrated circuit IC in the pad area PDA. The first fan-out lines GPL may include an initialization voltage line, a first data line, a second data line, and a third data line which extend from the display area. In an embodiment, the initialization voltage line, the first data line, the second data line, and the third data line may be formed of a second conductive layer in the display area, may extend to the pad area PDA, and may be electrically connected to the driving integrated circuit IC by being electrically connected to the first fan-out lines GPL in the pad area PDA.

The first fan-out lines GPL may be formed of a first conductive layer and may be electrically connected to the initialization voltage line, the first data line, the second data line, and the third data line formed of the second conductive layer. The first fan-out lines GPL may be disposed to overlap the first voltage line VDL and the second voltage line VSL formed of the third conductive layer and overlap the first auxiliary line AVDD and the second auxiliary line AVSS formed of the second conductive layer.

The first auxiliary line AVDD may extend in the first direction DR1, and an end and another end thereof may be electrically connected to the driving integrated circuit IC. The first auxiliary line AVDD may overlap the first voltage line VDL and may be electrically connected to the first voltage line VDL through a contact hole. Although FIG. 7 illustrates that a first voltage line VDL is electrically connected to the first auxiliary line AVDD, the disclosure is not limited thereto, and multiple first voltage lines VDL may be electrically connected to the first auxiliary line AVDD. The first auxiliary line AVDD may be disposed to overlap the second voltage line VSL and the first fan-out lines GPL in the third direction DR3.

The second auxiliary line AVSS may extend in the first direction DR1, and an end and another end thereof may be electrically connected to the driving integrated circuit IC. The second auxiliary line AVSS may be disposed closer to the driving integrated circuit IC than the first auxiliary line AVDD. However, the disclosure is not limited thereto, and the first auxiliary line AVDD may be disposed closer to the driving integrated circuit IC than to the second auxiliary line AVSS.

The second auxiliary line AVSS may overlap the second voltage line VSL and may be electrically connected to the second voltage line VSL through a contact hole. Although FIG. 7 illustrates that a second voltage line VSL is electrically connected to the second auxiliary line AVSS, the disclosure is not limited thereto, and second voltage lines VSL may be electrically connected to the second auxiliary line AVSS. The second auxiliary line AVSS may be disposed to overlap the first fan-out lines GPL in the third direction DR3.

The first auxiliary line AVDD and the second auxiliary line AVSS may each be formed as the second conductive layer and may be disposed to be spaced apart from each other in the second direction DR2.

Referring to FIGS. 8 and 9 in conjunction with FIG. 7, a light blocking layer BML may be disposed in a display area DPA of the substrate 110. A buffer layer 120 may be disposed on the light blocking layer BML over the display area DPA and the pad area PDA. An active layer ACT may be disposed on the buffer layer 120 in the display area DPA. A first gate insulating layer 130 may be disposed on the active layer ACT over the display area DPA and the pad area PDA.

A gate electrode G1 and the first fan-out line GPL may be disposed on the first gate insulating layer 130. The gate electrode G1 may be disposed in the display area DPA, and the first fan-out line GPL may be disposed in the pad area PDA. The gate electrode G1 and the first fan-out line GPL may contact an upper surface of the first gate insulating layer 130. A first interlayer insulating layer 150 may be disposed on the gate electrode G1 and the first fan-out line GPL. The first interlayer insulating layer 150 may be disposed over the display area DPA and the pad area PDA.

A first organic layer 155 may be disposed on the first interlayer insulating layer 150 in the pad area PDA. The first organic layer 155 may contact the first interlayer insulating layer 150 thereunder and may contact the first auxiliary line AVDD thereon. The first organic layer 155 may be disposed to overlap the pad area PDA and may not overlap the display area DPA. For example, the first organic layer 155 is formed in the pad area PDA and is not formed in the display area DPA.

The first organic layer 155 may be a planarization layer that planarizes a lower stepped portion formed by the first fan-out line GPL. The first interlayer insulating layer 150 disposed on the first fan-out line GPL may be made of an inorganic material and may be formed to be stepped along the first fan-out line GPL. In the first interlayer insulating layer 150, a seam may be generated by a tapered edge of the first fan-out line GPL. In case that the first auxiliary line AVDD is formed on the first interlayer insulating layer 150 in which the seam is generated, the first auxiliary line AVDD may contact the first fan-out line GPL through the seam, resulting in short circuit and burnt defects.

In an embodiment, the first organic layer 155 may be disposed on the first interlayer insulating layer 150 in the pad area PDA to planarize the lower stepped portion formed by the first fan-out line GPL, thereby preventing the short circuit and burnt defects from occurring. To this end, the first organic layer 155 may be made of an organic material having a planarization property. For example, the first organic layer 155 may include at least one selected from among an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, and polycarbonate. However, the disclosure is not limited thereto, and a material may be used as long as the material is an organic material having a planarization property.

The first organic layer 155 may not overlap the display area DPA. For example, the first organic layer 155 is not formed in the display area DPA. The first organic layer 155 may be made of an organic material, and thus, outgas may be generated. In case that outgas is generated in the display area DPA in which elements are formed, the elements may be degraded, thereby resulting in degradation in element characteristics. As described above, a first capacitance electrode CSE1 and a second capacitance electrode CSE2 are disposed in the display area DPA with the first interlayer insulating layer 150 interposed therebetween to form a storage capacitor. In case that the first organic layer 155 is disposed on the first interlayer insulating layer 150, a permittivity between the first capacitance electrode CSE1 and the second capacitance electrode CSE2 may be changed, and thus, the storage capacitor may be difficult to form. Therefore, in an embodiment, the first organic layer 155 may be disposed to not overlap the display area DPA and to overlap the pad area PDA, thereby preventing degradation in element characteristics and readily forming the storage capacitor.

A source electrode SE, a drain electrode DE, and a data line DTL may be disposed on the first interlayer insulating layer 150 in the display area DPA, and the first auxiliary line AVDD may be disposed on the first organic layer 155 in the pad area PDA. The source electrode SE, the drain electrode DE, the data line DTL, and the first auxiliary line AVDD may be made of the same material and may be disposed on different layers as described above. A second interlayer insulating layer 170 may be disposed on the source electrode SE, the drain electrode DE, the data line DTL, and the first auxiliary line AVDD over the display area DPA and the pad area PDA.

The first voltage line VDL and the second voltage line VSL may be disposed on the second interlayer insulating layer 170 in the display area DPA, and the second voltage line VSL may be disposed on the second interlayer insulating layer 170 in the pad area PDA. The second voltage line VSL in the pad area PDA may extend from the display area DPA to the pad area PDA. A third interlayer insulating layer 190 may be disposed on the first voltage line VDL and the second voltage line VSL over the display area DPA and the pad area PDA.

A stacked structure such as a light-emitting element 300 may be disposed on the third interlayer insulating layer 190 in the display area DPA. The stacked structure has been described above with reference to FIG. 5, and thus, descriptions thereof will be omitted.

Hereinafter, a method of manufacturing the above-described display device according to an embodiment will be described. Hereinafter, an example of a method of manufacturing the above-described cross-sectional structure of FIG. 8 will be described.

FIGS. 10 to 14 are schematic cross-sectional views illustrating operations of a method of manufacturing a display device according to an embodiment.

Figure 10:
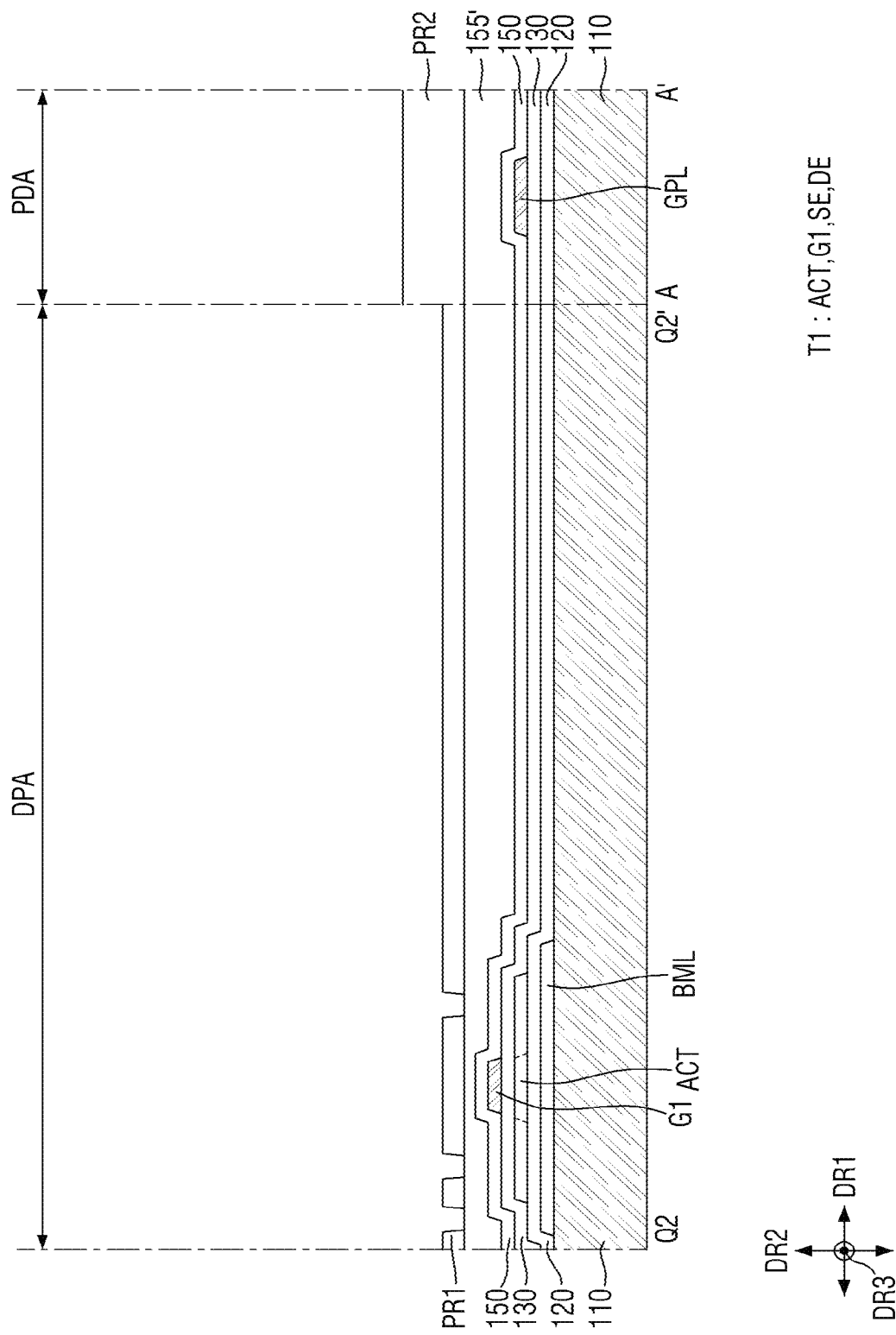
FIGS. 10 to 14 are schematic cross-sectional views illustrating operations (or steps) of a method of manufacturing a display device according to one embodiment.

Referring to FIG. 10, a light blocking layer BML is formed on a substrate 110, and a buffer layer 120 and a semiconductor layer disposed thereon are formed. The light blocking layer BML may be formed by a mask process. For example, a material layer for a light blocking layer may be deposited on the entirety of the substrate 110 and then patterned by a photolithography process to form the light blocking layer BML as shown in FIG. 10.

The buffer layer 120 may be formed by depositing a material layer for a buffer layer on the entirety of the substrate 110, and the semiconductor layer may include an active layer ACT of a first transistor T1. The active layer ACT may be formed by a mask process. For example, an oxide semiconductor may be deposited on the entirety of the buffer layer 120 and then patterned by a photolithography process to form the active layer ACT as shown in FIG. 10. Hereinafter, since each layer may be formed by a process similar to that described above, repetitive or detailed descriptions thereof will be omitted, and a process sequence will be described in detail.

Subsequently, a first gate insulating layer 130 and a first conductive layer disposed thereon are formed on the buffer layer 120 on which the semiconductor layer is formed. The first conductive layer may include a gate electrode G1 disposed in a display area DPA and a first fan-out line GPL disposed in a pad area PDA. The first gate insulating layer 130 may be formed by depositing a material layer for a gate insulating layer on the entirety of the substrate 110, and the first conductive layer may be formed by a mask process.

Next, a first interlayer insulating layer 150 is formed on the first gate insulating layer 130 on which the first conductive layer is formed, and a material layer 155' for an organic material layer is formed. The first interlayer insulating layer 150 and the material layer 155' for an organic material layer are formed on the entirety of the substrate 110. The material layer 155' for an organic material layer may be formed by a solution process, for example, a spin coating process, a slit coating process, or a printing process.

Next, a photoresist is applied on the material layer 155' for an organic material layer, and a first photoresist pattern PR1 and a second photoresist pattern PR2 are formed in the display area DPA and the pad area PDA by using a halftone mask, respectively. The second photoresist pattern PR2 is formed to be thicker than the first photoresist pattern PR1 such that the material layer 155' for an organic material layer disposed under the second photoresist pattern PR2 remains in a subsequent process.

Figure 11:
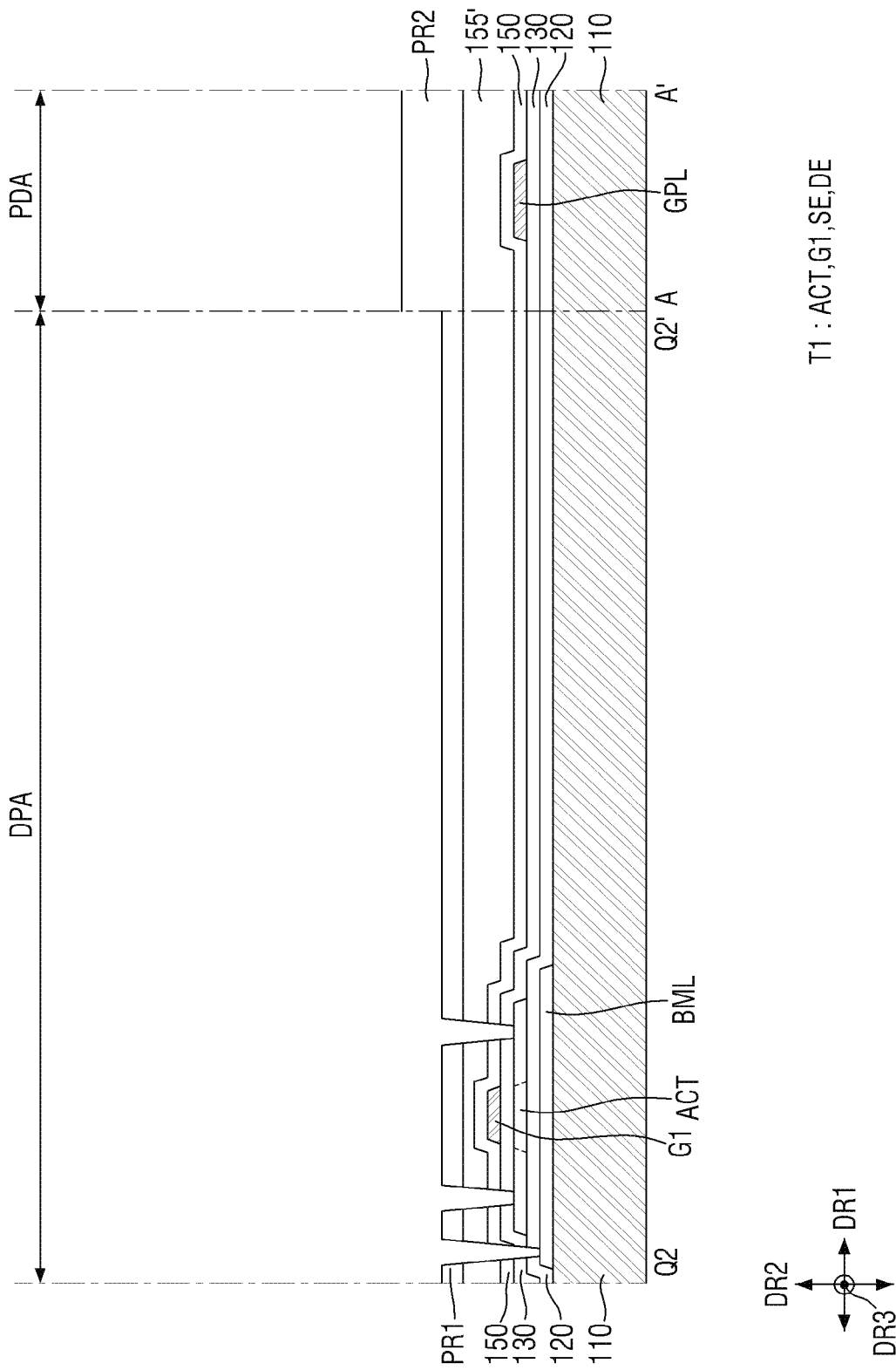

After that, referring to FIG. 11, the material layer 155' for an organic material layer, the first interlayer insulating layer 150, the first gate insulating layer 130, and the buffer layer 120, which are exposed, are etched using the first photoresist pattern PR1 as a mask to form contact holes partially exposing the light blocking layer BML and the semiconductor layer.

Figure 12:
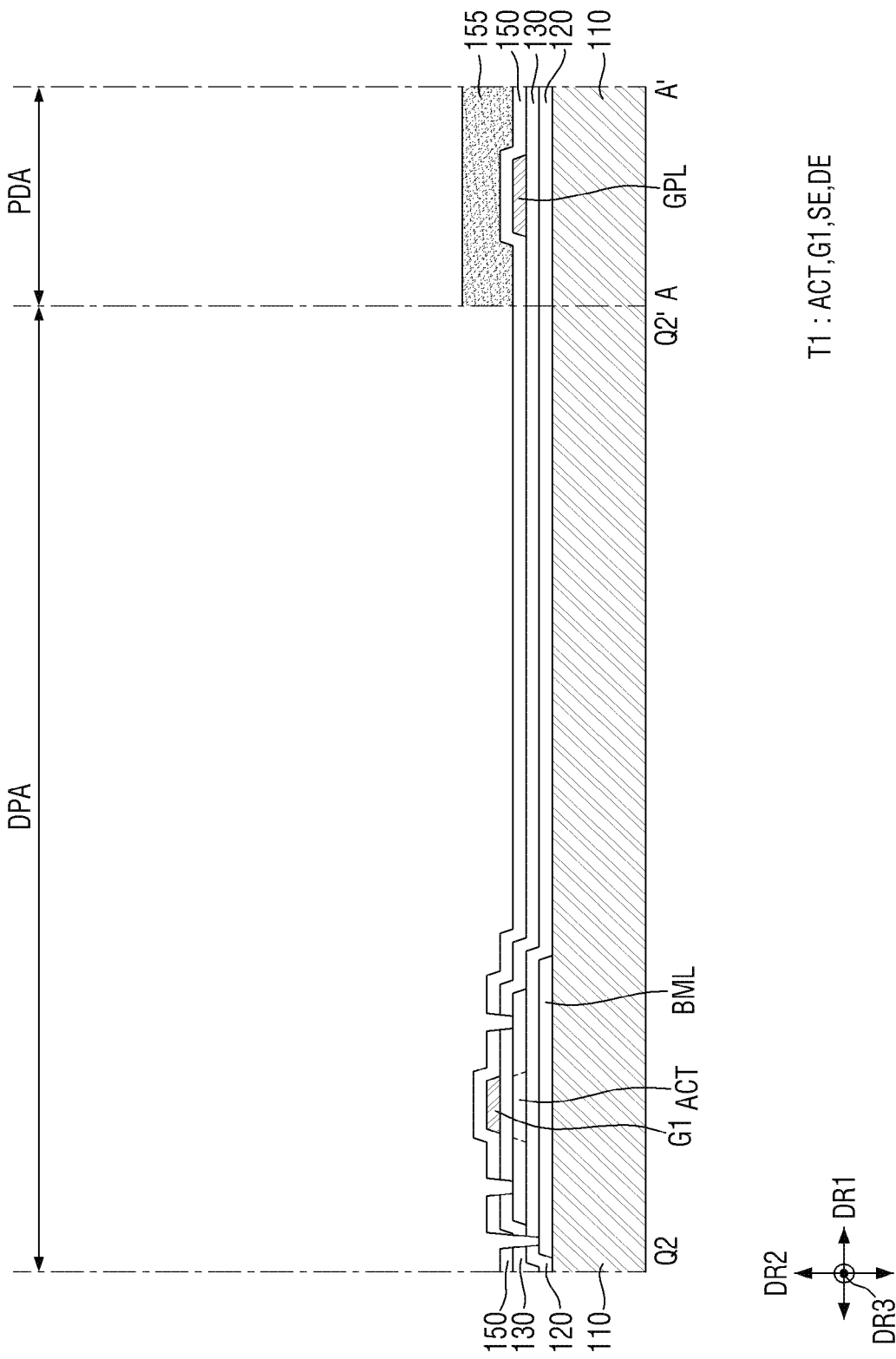

Next, referring to FIG. 12, ashing is performed on the substrate 110 to remove the first photoresist pattern PR1 and the material layer 155' for an organic material layer in the display area DPA and remove the second photoresist pattern PR2 in the pad area PDA to form a first organic layer 155. As described above, since the second photoresist pattern PR2 is thick, the material layer 155' for an organic material layer disposed under the second photoresist pattern PR2 may remain to be formed as the first organic layer 155 by an ashing process.

Figure 13:
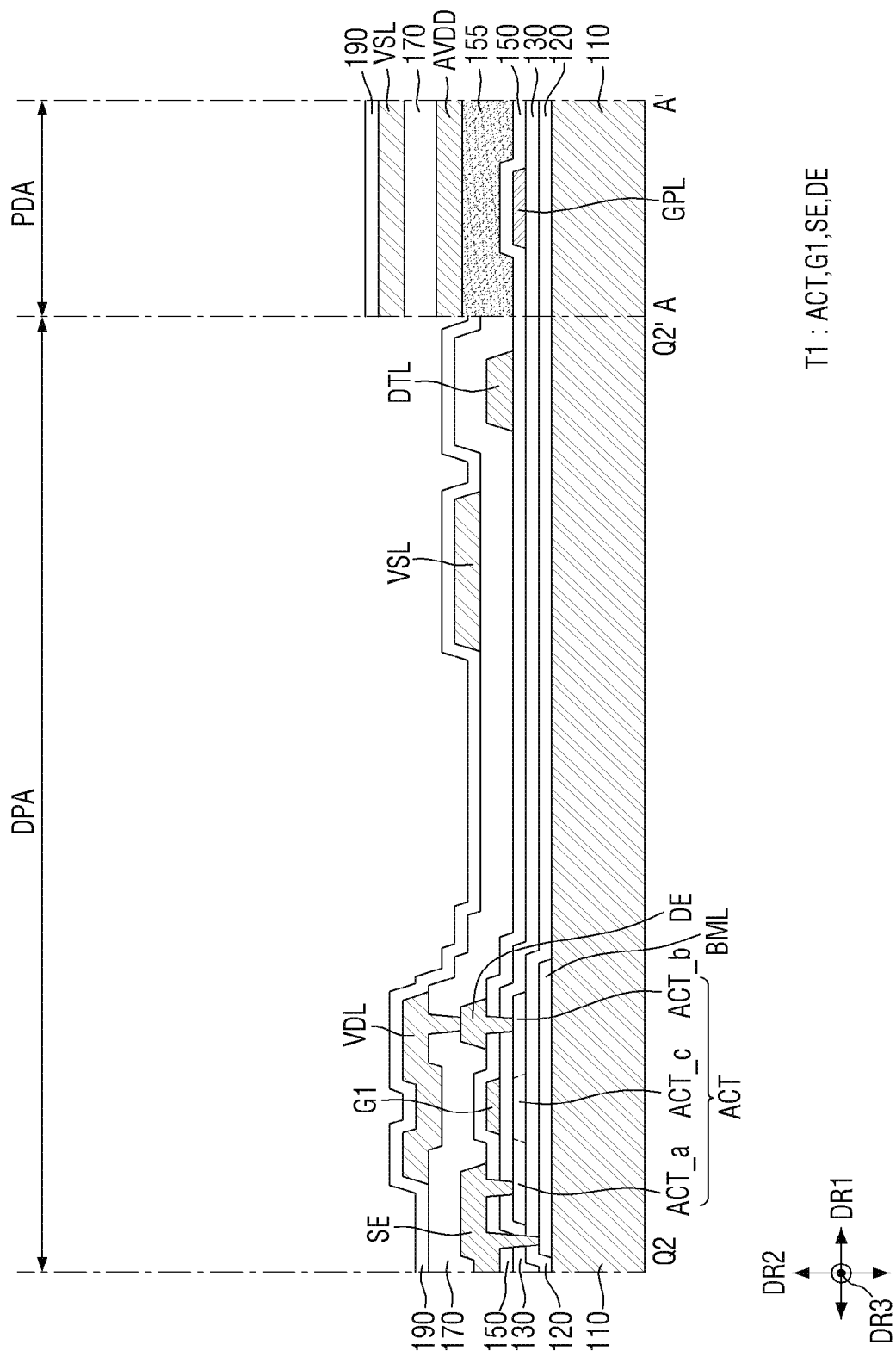

Then, referring to FIG. 13, a second conductive layer is formed on the first interlayer insulating layer 150 in which the contact holes are formed. The second conductive layer may be formed by a mask process. The second conductive layer may include a source electrode SE, a drain electrode DE, and a data line DTL disposed in the display area DPA and a first auxiliary line AVDD disposed in the pad area PDA. The second conductive layer disposed in the display area DPA may be electrically connected to the light blocking layer BML or the active layer ACT because of materials of the second conductive layer deposited into the contact holes formed in the first interlayer insulating layer 150. Accordingly, the source electrode SE may be electrically connected to the active layer ACT and the light blocking layer BML, and the drain electrode DE may be electrically connected to the active layer ACT.

Subsequently, a second interlayer insulating layer 170 is formed on the first interlayer insulating layer 150 on which the second conductive layer is formed, and contact holes partially exposing the second conductive layer are formed. The second interlayer insulating layer 170 may be formed to cover (or overlap) the first organic layer 155 in the pad area PDA. The second interlayer insulating layer 170, the contact holes thereof, and the first interlayer insulating layer 150 may be formed by the same process.

Next, a third conductive layer is formed on the second interlayer insulating layer 170 in which the contact holes are formed. The third conductive layer may be formed by a mask process. The third conductive layer may include a first voltage line VDL, a second voltage line VSL, and a first conductive pattern CDP disposed in the display area DPA and a second voltage line VSL disposed in the pad area PDA. The third conductive layer disposed in the display area DPA may be electrically connected to the second conductive layer because of materials of the third conductive layer deposited into the holes formed in the second interlayer insulating layer 170.

Subsequently, a third interlayer insulating layer 190 is formed on the second interlayer insulating layer 170 on which the third conductive layer is formed. The third interlayer insulating layer 190 may be formed over the display area DPA and the pad area PDA and may cover (or overlap) the second voltage line VSL in the pad area PDA.

Figure 14:
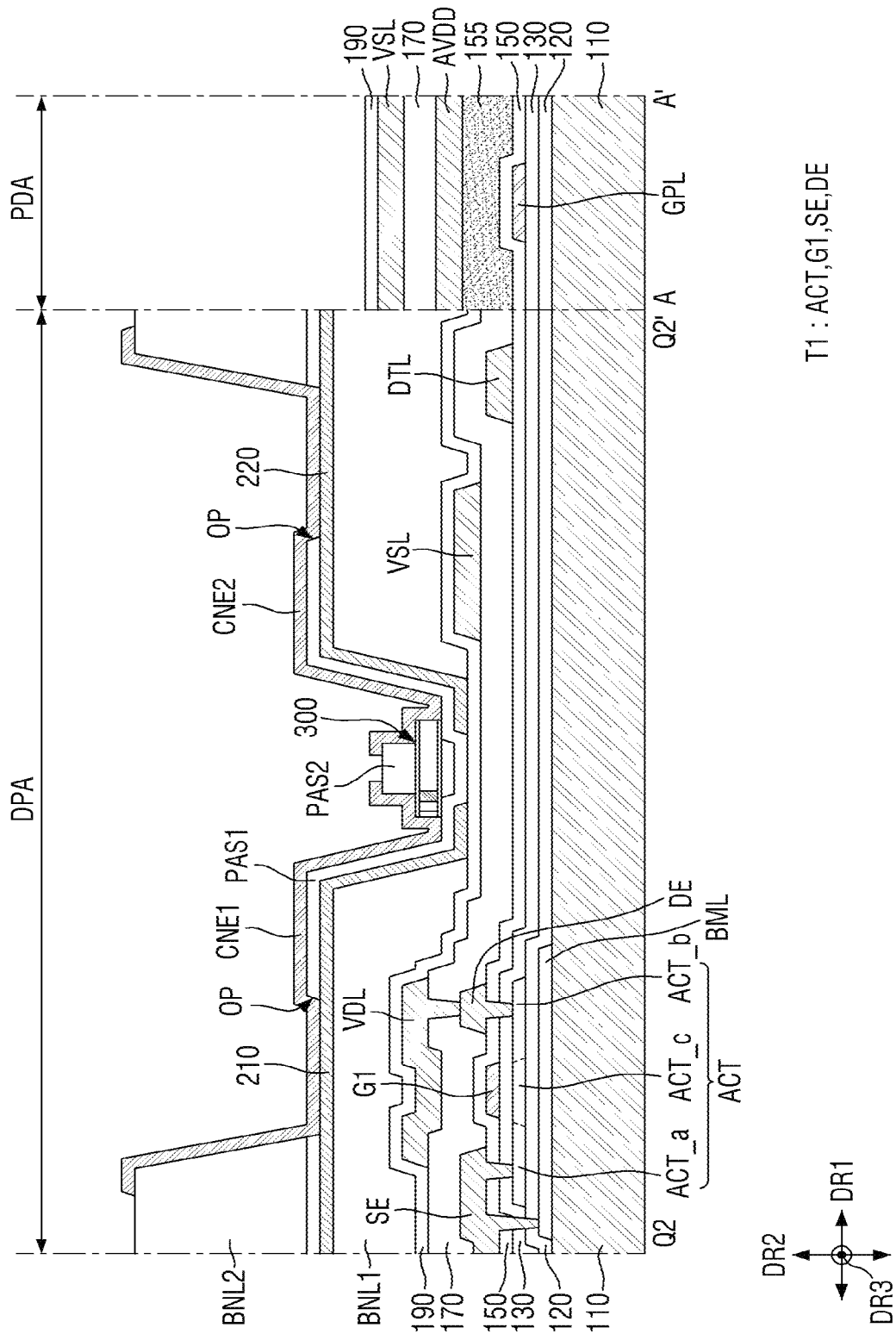

Next, referring to FIG. 14, first patterns BNL1 are formed on the third interlayer insulating layer 190. The first patterns BNL1 may be made of (or include) an organic material including a photosensitive material and may be formed by applying an organic material layer and then performing exposure and development thereon. In an embodiment, no additional layers may be stacked in the pad area PDA.

Subsequently, first and second electrodes 210 and 220 disposed on the third interlayer insulating layer 190 and the first patterns BNL1 are formed. The first and second electrodes 210 and 220 may be formed by a mask process. The first and second electrodes 210 and 220 may be formed by depositing a material layer for an electrode on the entirety of the substrate 110, on which the third interlayer insulating layer 190 and the first patterns BNL1 are formed, and then patterning the material layer for an electrode. In a patterning process of the material layer for an electrode, the first electrode 210 and the second electrode 220 are formed to extend in a direction and be spaced apart from each other.

A first insulating layer PAS1 is formed on the first and second electrodes 210 and 220, and a second pattern BNL2 is formed on the first insulating layer PAS1 in the display area DPA. The first insulating layer PAS1 may be formed by depositing an insulating material layer in the entirety of the display area DPA. The second pattern BNL2 may be disposed on the first insulating layer PAS1, and the first and second patterns BNL1 and BNL2 may be formed by the same process. A portion of the second pattern BNL2 may be disposed on the first pattern BNL1 and may be formed to be higher than the first pattern BNL1.

Subsequently, the light-emitting elements 300 are disposed on the first insulating layer PAS1 in the display area DPA. According to an embodiment, the light-emitting elements 300 may be disposed by an inkjet printing process of spraying an ink, in which the light-emitting elements 300 are dispersed, on the first and second electrodes 210 and 220. The ink sprayed by an inkjet printing apparatus may be seated in an area surrounded by the second pattern BNL2. The second pattern BNL2 may prevent the ink from overflowing into other adjacent subpixels.

In case that the ink including the light-emitting elements 300 is sprayed, an electrical signal is applied to the first and second electrodes 210 and 220 to arrange the light-emitting elements 300 on the first insulating layer PAS1. In case that the electrical signal is applied to the first and second electrodes 210 and 220, an electric field may be generated on the first and second electrodes 210 and 220. The light-emitting elements 300 dispersed in the ink may receive a dielectrophoretic force by the electric field, and while the orientation direction and position of the light-emitting elements 300 receiving the dielectrophoretic force are changed, the light-emitting elements 300 may be seated on the first insulating layer PAS1. Both end portions of the light-emitting element 300 may be disposed on the first electrode 210 and the second electrode 220.

Subsequently, a second insulating layer PAS2 that fixes the position of the light-emitting element 300 is formed, and the first insulating layer PAS1 is partially patterned to form openings OP that partially expose upper surfaces of the first and second electrodes 210 and 220. The second insulating layer PAS2 may be formed by depositing an insulating material layer on the entirety of the first insulating layer PAS1 and then patterning the insulating material layer so as to expose both end portions of the light-emitting element 300. In case that the second insulating layer PAS2 is formed, the first insulating layer PAS1 is partially removed to form the openings OP, and the first and second electrodes 210 and 220 are separated in a cutout area.

Next, connection electrodes CNE1 and CNE2 are formed on the first insulating layer PAS1 and the second insulating layer PAS2. The connection electrodes CNE1 and CNE2 may be formed by depositing a material layer for a connection electrode on the entireties of the first and second insulating layers PAS1 and PAS2 and then patterning the material layer for a connection electrode. The material layer for a connection electrode may be deposited into the openings OP of the first insulating layer PAS1, and the connection electrodes CNE1 and CNE2 may be connected to the first and second electrodes 210 and 220.

Subsequently, although not shown in the drawings, a third insulating layer is formed on the entirety of the substrate 110 to manufacture a display device 10. However, the third insulating layer may be omitted.

As described above, in a manufacturing process of the display device 10 according to an embodiment, the first organic layer 155 is formed in the pad area PDA, and there is no need for a separate mask process for preventing the first organic layer 155 from being formed in the display area DPA. Accordingly, the mask process of the display device 10 can be reduced, thereby improving process efficiency.

Figure 15:
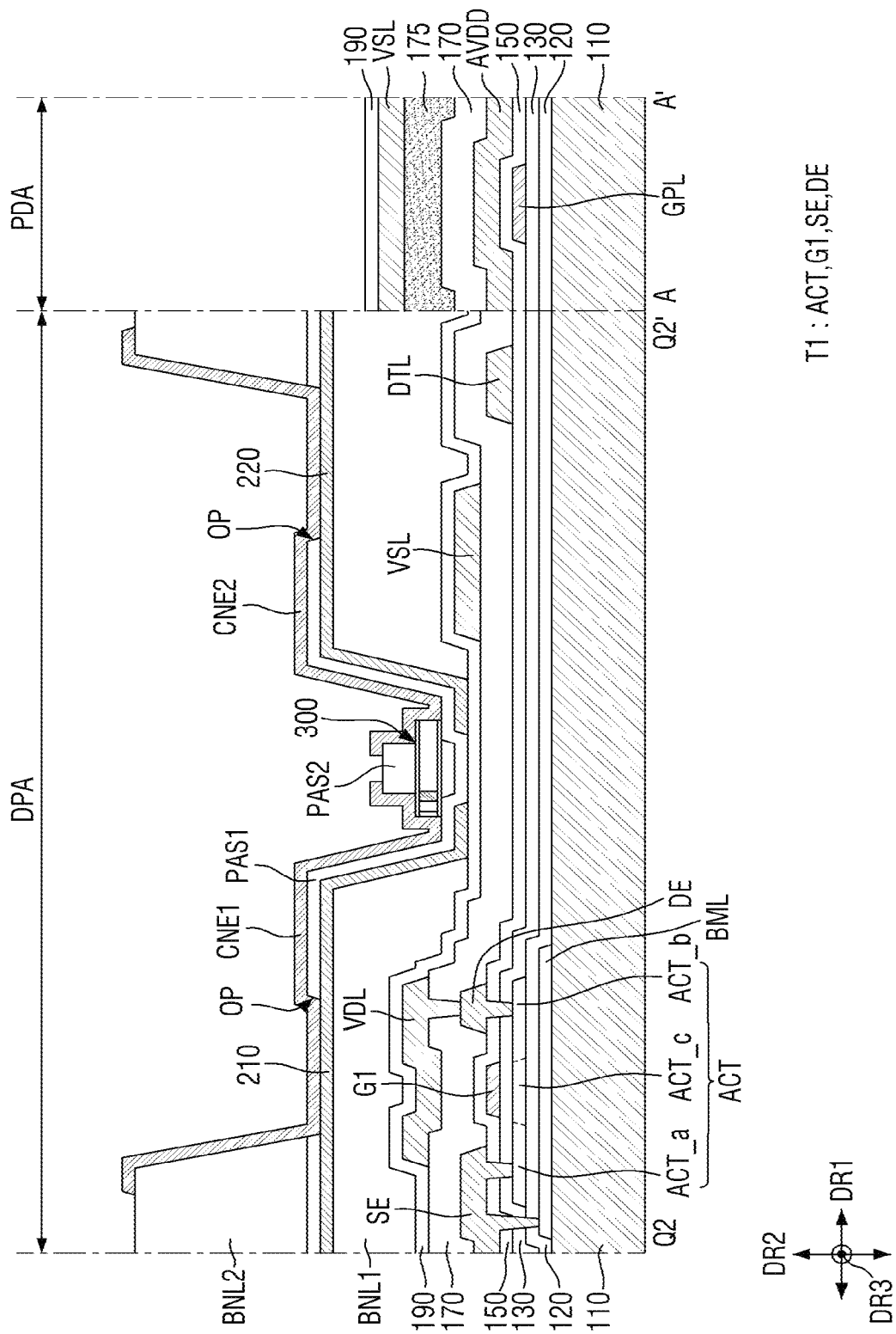
FIG. 15 is a schematic cross-sectional view illustrating a display device according to another embodiment.

FIG. 15 is a schematic cross-sectional view illustrating a display device according to an embodiment. FIG. 15 is a schematic cross-sectional view of an example taken along line Q2-Q2' of FIG. 4 and line A-A' of FIG. 7.

Referring to FIG. 15, a display device 10 according to an embodiment may include a second organic layer 175 in a pad area PDA. The embodiment is different from the above-described embodiments of FIGS. 8 to 14 in that the second organic layer 175 is disposed between a second interlayer insulating layer 170 and a second voltage line VSL. Hereinafter, different configurations will be described in detail, and the same configurations will be briefly described. In particular, since a configuration of a display area DPA is the same as that of FIG. 8, descriptions thereof will be omitted.

Referring to FIG. 15, in the pad area PDA, a buffer layer 120 and a first gate insulating layer 130 may be sequentially disposed on a substrate 110, and a first fan-out line GPL may be disposed on the first gate insulating layer 130. A first interlayer insulating layer 150 may be disposed on the first fan-out line GPL, and a first auxiliary line AVDD may be disposed on the first interlayer insulating layer 150. FIG. 15 illustrates only the first auxiliary line AVDD, but a second auxiliary line AVSS may also be disposed.

A second interlayer insulating layer 170 may be disposed on the first auxiliary line AVDD, and the second organic layer 175 may be disposed on the second interlayer insulating layer 170. The second organic layer 175 may be disposed to overlap the pad area PDA and may not overlap the display area DPA. For example, the second organic layer 175 is formed in the pad area PDA and is not formed in the display area DPA.

The second organic layer 175 may be a planarization layer that planarizes a lower stepped portion formed by the first fan-out line GPL. The first interlayer insulating layer 150 and the second interlayer insulating layer 170 disposed on the first fan-out line GPL may be made of an inorganic material and may be formed to be stepped along the first fan-out line GPL. For example, in the second interlayer insulating layer 170, a seam may be generated by a stepped portion due to a tapered edge of the first fan-out line GPL. In case that the second voltage line VSL is formed on the second interlayer insulating layer 170 on which the seam is generated, the second voltage line VSL may contact the first auxiliary line AVDD through the seam, thereby resulting in short circuit and burnt defects.

In an embodiment, the second organic layer 175 may be disposed on the second interlayer insulating layer 170 in the pad area PDA to planarize the lower stepped portion formed by the first fan-out line GPL, thereby preventing the short circuit and burnt defects from occurring. To this end, the second organic layer 175 may be made of an organic material having a planarization property, and the second organic layer 175 and the first organic layer 155 described above may be made of the same material.

The second organic layer 175 may not overlap the display area DPA. For example, the second organic layer 175 is not formed in the display area DPA. The second organic layer 175 may be made of an organic material, and thus, outgas may be generated. In case that outgas is generated in the display area DPA in which elements are formed, the elements may be degraded, thereby resulting in degradation in element characteristics. Therefore, in an embodiment, the second organic layer 175 may be disposed to not overlap the display area DPA and to overlap the pad area PDA, thereby preventing degradation in element characteristics.

The second voltage line VSL may be disposed on the second organic layer 175 in the pad area PDA. FIG. 15 illustrates only the second voltage line VSL disposed on the second organic layer 175, but a first voltage line VDL may also be disposed to extend from the display area DPA. A third interlayer insulating layer 190 may be disposed on the second voltage line VSL. The second organic layer 175 may be disposed between the second interlayer insulating layer 170 and the third interlayer insulating layer 190 and may contact each of the second interlayer insulating layer 170 and the third interlayer insulating layer 190.

Figure 16:
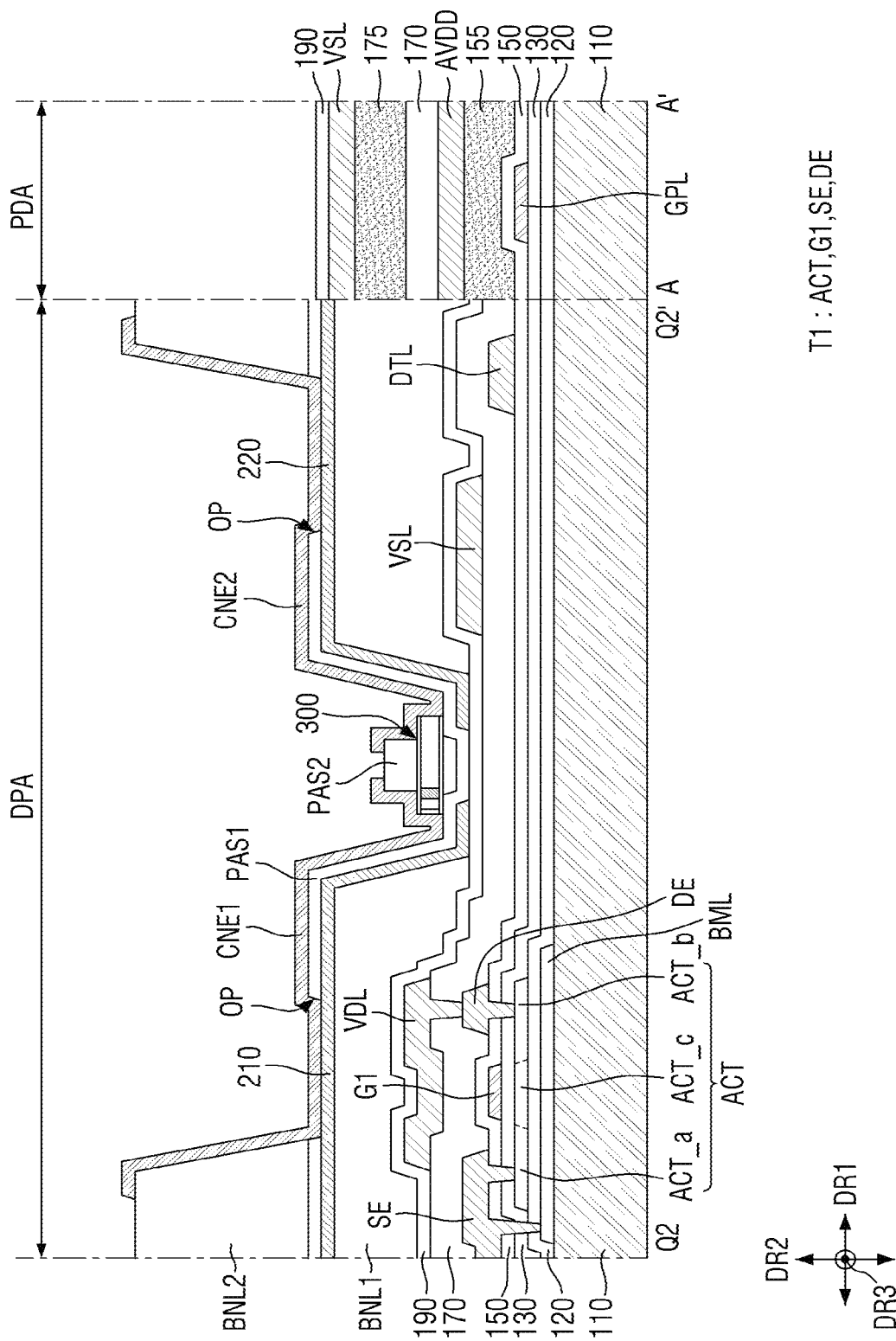
FIG. 16 is a schematic cross-sectional view illustrating a display device according to still another embodiment.

FIG. 16 is a schematic cross-sectional view illustrating a display device according to an embodiment. FIG. 16 is a schematic cross-sectional view of an example taken along line Q2-Q2' of FIG. 4 and line A-A' of FIG. 7.

Referring to FIG. 16, a display device 10 according to an embodiment may include a first organic layer 155 and a second organic layer 175 in a pad area PDA. The embodiment is different from the above-described embodiments of FIGS. 8 to 14 in that the first organic layer 155 is disposed between a first interlayer insulating layer 150 and a first auxiliary line AVDD, and the second organic layer 175 is disposed between a second interlayer insulating layer 170 and a second voltage line VSL. Hereinafter, different con-figurations will be described in detail, and the same configurations will be briefly described. In particular, since a configuration of a display area DPA is the same as that of FIG. 8, descriptions thereof will be omitted.

Referring to FIG. 16, in the pad area PDA, a buffer layer 120 and a first gate insulating layer 130 may be sequentially disposed on a substrate 110, and a first fan-out line GPL may be disposed on the first gate insulating layer 130. A first interlayer insulating layer 150 may be disposed on the first fan-out line GPL, and the first organic layer 155 may be disposed on the first interlayer insulating layer 150. As described above, the first organic layer 155 may prevent the first fan-out line GPL and the first auxiliary line AVDD from being short-circuited with each other such as to cause burnt defects because of a stepped portion due to the first fan-out line GPL.

The first auxiliary line AVDD may be disposed on the first organic layer 155. The second interlayer insulating layer 170 may be disposed on the first auxiliary line AVDD, and the second organic layer 175 may be disposed on the second interlayer insulating layer 170. The second organic layer 175 may be disposed to overlap the first organic layer 155. As described above, the second organic layer 175 may prevent the second voltage line VSL and the first auxiliary line AVDD from being short-circuited with each other such as to cause burnt defects because of a stepped portion due to the first fan-out line GPL.

The first organic layer 155 and the second organic layer 175 may be disposed to overlap the pad area PDA and may not overlap the display area DPA. For example, the second organic layer 175 is formed in the pad area PDA and is not formed in the display area DPA. As described above, the first organic layer 155 and the second organic layer 175 may prevent degradation in element characteristics due to outgas.

The second voltage line VSL may be disposed on the second organic layer 175 in the pad area PDA, and a third interlayer insulating layer 190 may be disposed on the second voltage line VSL.

Figure 17:
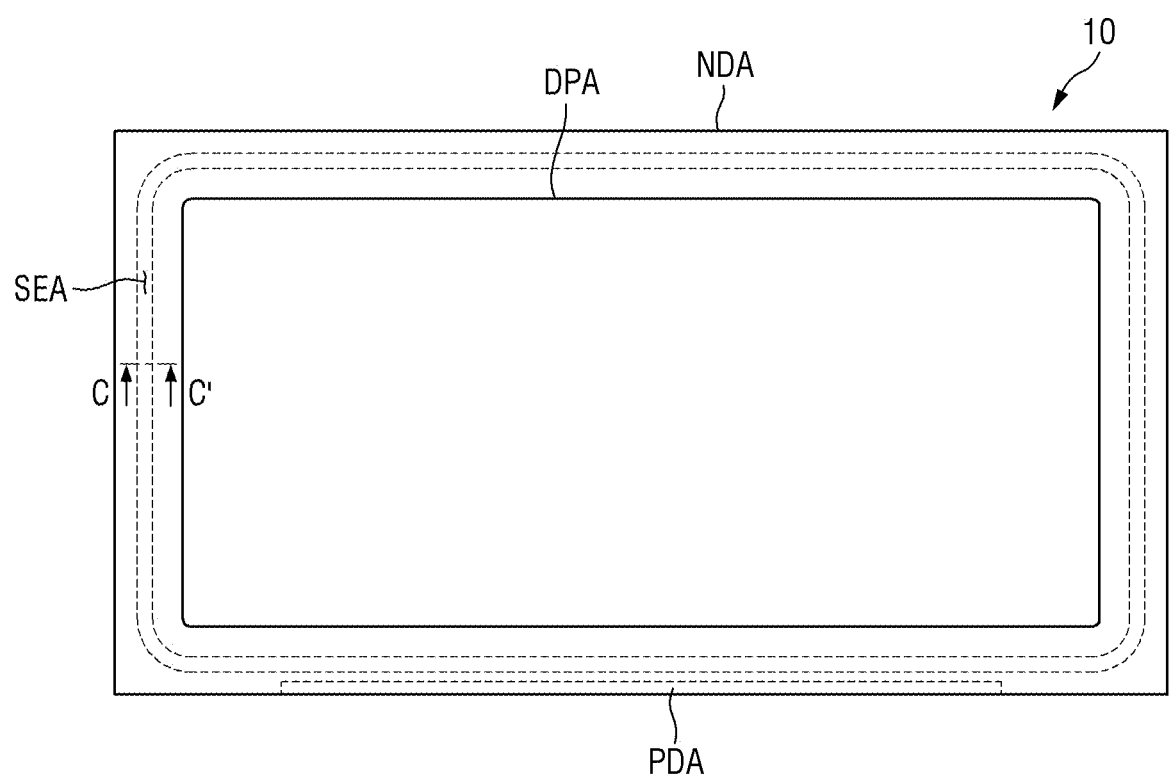
FIG. 17 is a schematic plan view illustrating a display device according to yet another embodiment.
Figure 18:
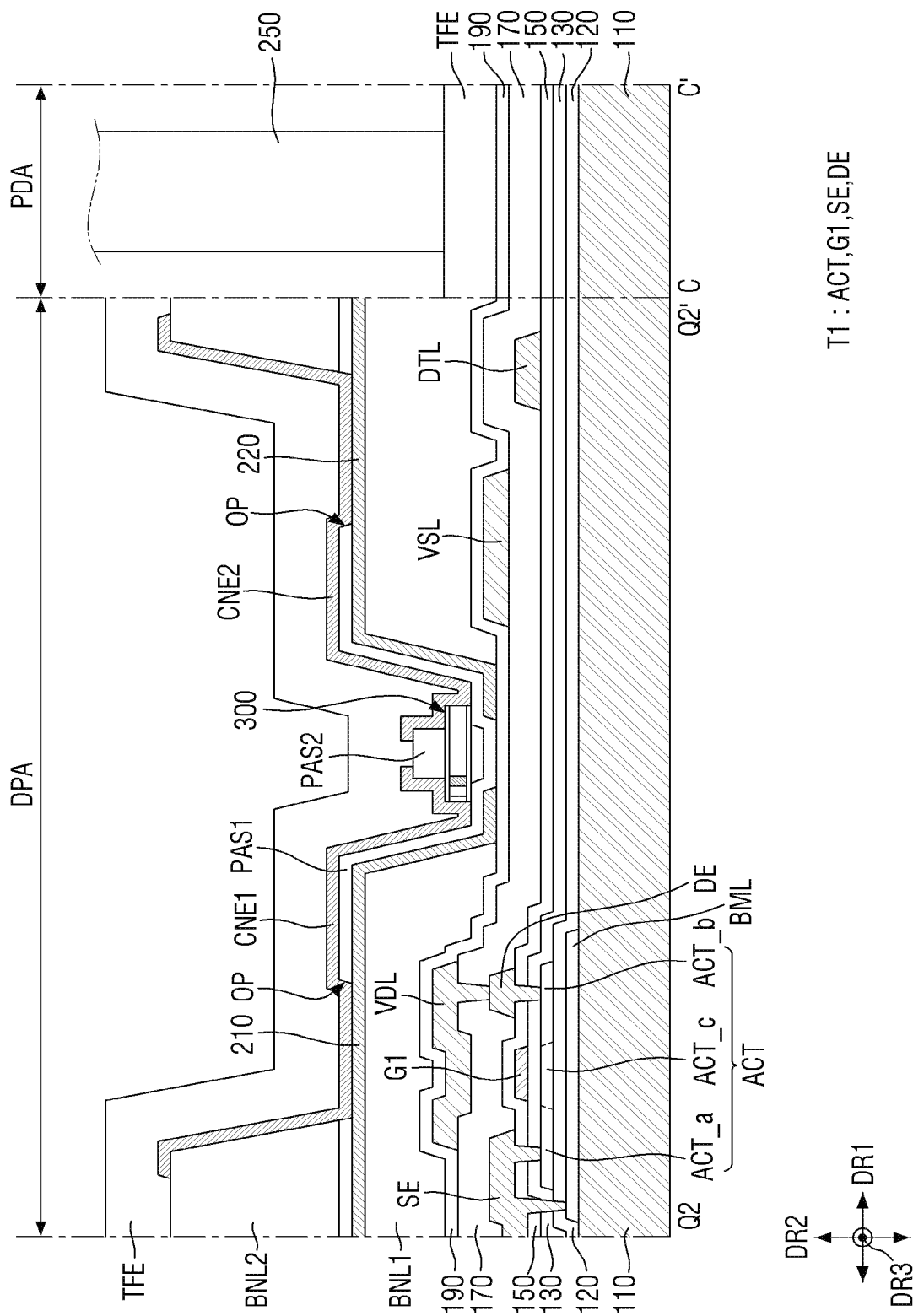
FIG. 18 shows a schematic cross-sectional view taken along line Q2-Q2' of FIG. 4 and line C-C' of FIG. 17.

FIG. 17 is a schematic plan view illustrating a display device according to an embodiment. FIG. 18 illustrates a schematic cross-sectional view taken along line Q2-Q2' of FIG. 4 and line C-C' of FIG. 17.

Referring to FIGS. 17 and 18, a display device 10 according to an embodiment is different from those of the above-described embodiments of FIGS. 8 to 16 in that a first organic layer 155 and/or a second organic layer 175 are not disposed in a seal area SEA. Hereinafter, different configurations will be described in detail, and same configurations will be briefly described. In particular, since a configuration of a display area DPA is the same as that of FIG. 8, descriptions thereof will be omitted.

Referring to FIG. 17, as described above, the display device 10 may include the display area DPA and a non-display area NDA. The non-display area NDA may include the seal area SEA and a pad area PDA. The seal area SEA may include an adhesive member that surrounds the display area DPA and seals the display device 10. Although FIG. 17 illustrates that the seal area SEA has a single line shape, the disclosure is not limited thereto, and the seal area SEA may be arranged in line shapes. The pad area PDA may be disposed at a side of the display area DPA, and a driving integrated circuit may be electrically connected thereto. The pad area PDA may be disposed to correspond to a long side of the display area DPA and may also be disposed to correspond to a short side of the display area DPA. Although FIG. 17 illustrates only a pad area PDA, the disclosure is not limited thereto, and an additional pad area PDA corresponding to the short side of the display area DPA may be provided, and pad areas PDA corresponding to four sides of the display area DPA may be provided.

Referring to FIG. 18 in conjunction with FIG. 17, an encapsulation layer TFE for protecting a first transistor T1 and light-emitting elements 300 disposed on a substrate 110 may be disposed in the display area DPA. The encapsulation layer (or thin film encapsulation layer) TFE may include at least one inorganic film and at least one organic film. For example, the encapsulation layer TFE may have a stacked structure in which an organic film is interposed between two inorganic films. However, the disclosure is not limited thereto, and the encapsulation layer TFE may have a multi-layered structure in which inorganic layers and organic layers interposed between the inorganic layers are stacked.

A buffer layer 120, a first gate insulating layer 130, a first interlayer insulating layer 150, a second interlayer insulating layer 170, and a third interlayer insulating layer 190 may be sequentially stacked on the substrate 110 in the seal area SEA. The encapsulation layer TFE disposed in the display area DPA may extend to the seal area SEA and may be disposed on the third interlayer insulating layer 190.

An adhesive member 250 may be disposed on the third interlayer insulating layer 190 in the seal area SEA. The adhesive member 250 may seal the display device 10 by bonding the substrate 110 and a counter substrate facing the substrate 110. The adhesive member 250 may be a sealant. The adhesive member 250 may contact an upper surface of the encapsulation layer TFE.

In an embodiment, the first organic layer 155 (see FIG. 16) and/or the second organic layer 175 (see FIG. 16) described above may not be disposed in the seal area SEA. In case that an organic layer made of an organic material is disposed in the seal area SEA, the organic layer functions as a path through which external moisture permeates, thereby resulting in defects such as degradation of elements due to the permeation of the moisture. In the embodiment, the first organic layer 155 (see FIG. 16) and/or the second organic layer 175 (see FIG. 16) are formed to not overlap the seal area SEA, thereby preventing the permeation of the external moisture.

The adhesive member 250 disposed in the seal area SEA may be disposed to overlap the buffer layer 120, the first gate insulating layer 130, the first interlayer insulating layer 150, the second interlayer insulating layer 170, the third interlayer insulating layer 190, and the encapsulation layer TFE. The adhesive member 250 may be disposed to not overlap the first organic layer 155 (see FIG. 16) and/or the second organic layer 175 (see FIG. 16). Although not shown in the drawings, in case that an organic film is included in the encapsulation layer TFE, the organic film of the encapsulation layer TFE may be removed from the seal area SEA and the pad area PDA. The first organic layer 155 (see FIG. 16) and/or the second organic layer 175 (see FIG. 16) may be removed from the seal area SEA in the same manner as those removed from the above-described display area DPA of FIGS. 10 to 14.

Figure 19:
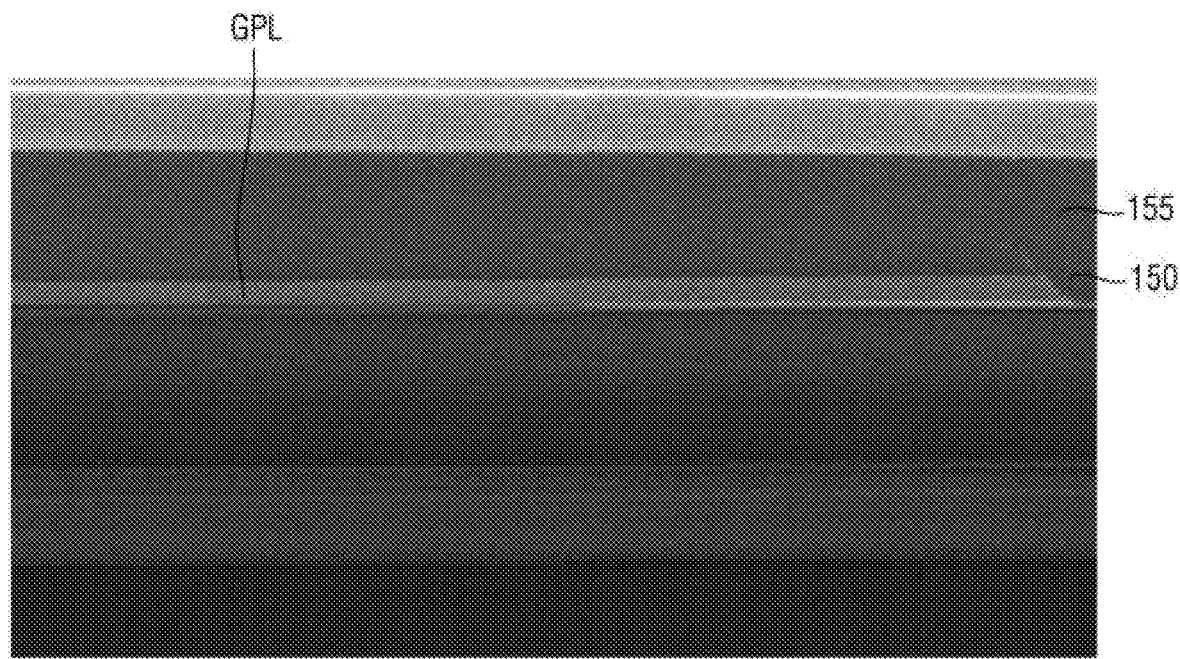
FIGS. 19 and 20 are scanning electron microscope (SEM) images of a pad area of a display device according to an embodiment.
Figure 20:
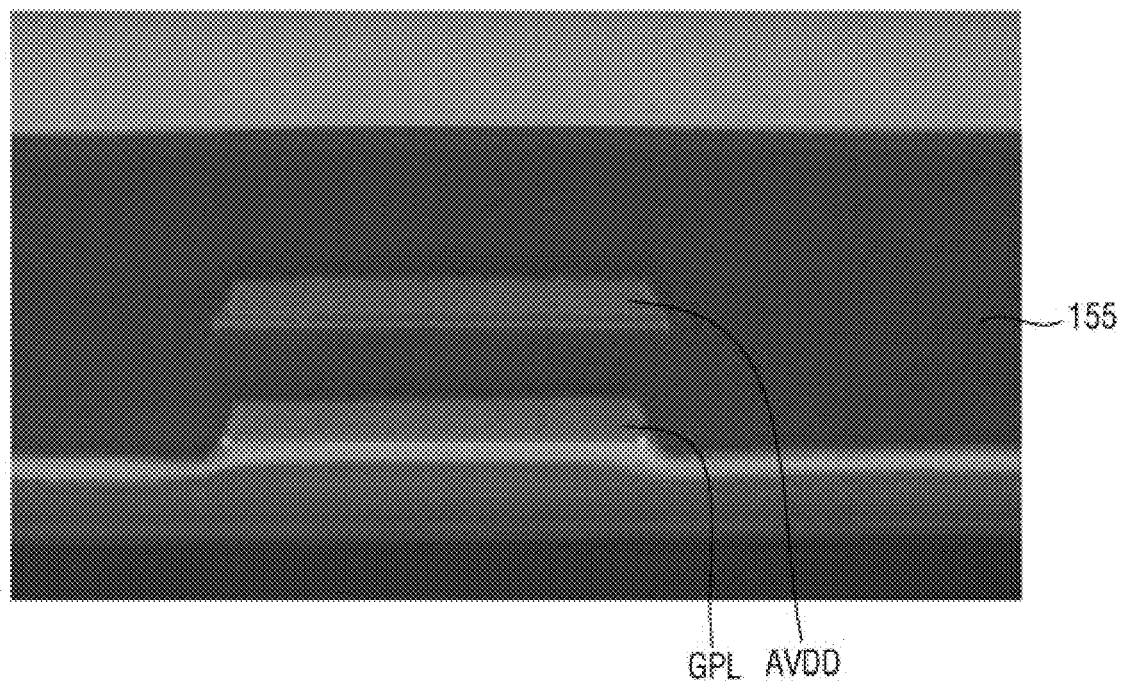

FIGS. 19 and 20 are scanning electron microscope (SEM) images of a pad area of a display device according to an embodiment.

Referring to FIG. 19, a first interlayer insulating layer 150 and a first organic layer 155 are disposed on a first fan-out line GPL. FIG. 19 illustrates that the first organic layer 155 planarizes a stepped portion of the first interlayer insulating layer 150.

Referring to FIG. 20, a first organic layer 155 is disposed on a first fan-out line GPL, and a first auxiliary line AVDD is disposed on the first organic layer 155. FIG. 20 illustrates that the first organic layer 155 planarizes a lower stepped portion so that the first auxiliary line AVDD is formed to be flat.

Therefore, in a display device according to an embodiment, an organic layer is disposed on a first fan-out line GPL in a pad area PDA to planarize a stepped portion due to the first fan-out line GPL, thereby preventing the short circuit and burnt defects between lines.

Since a display device according to embodiments includes at least one organic layer that does not overlap a display area and overlaps a pad area, it is possible to prevent short circuit and burnt defects from occurring in lines formed at an upper side due to a stepped portion of a line.

In addition, since a display device according to embodiments includes at least one organic layer that does not overlap a seal area and overlaps a pad area, it is possible to prevent the permeation of external moisture.

Furthermore, since a display device according to embodiments includes at least one organic layer that does not overlap a display area and overlaps a pad area, it is possible to prevent the degradation of elements due to outgas such that a storage capacitor is readily formed.

Effects of the disclosure are not limited to the embodiments set forth herein, and more diverse effects are included in the specification.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a substrate including a display area and a pad area;
   a transistor including:
      an active layer disposed on the display area;
      a gate electrode disposed on the active layer; and
      a source electrode and a drain electrode disposed on the gate electrode;
   a fan-out line disposed on the pad area;
   an auxiliary line disposed on the fan-out line;
   a first interlayer insulating layer disposed between the gate electrode and the source electrode and between the fan-out line and the auxiliary line; and
   a first organic layer disposed between the first interlayer insulating layer and the auxiliary line,
   wherein the first organic layer does not overlap the display area.

2. The display device of claim 1, wherein the first interlayer insulating layer includes at least one of silicon oxide, silicon nitride, silicon oxynitride, aluminum oxide, zirconium oxide, and aluminum nitride.

3. The display device of claim 1, wherein the first organic layer includes at least one of polymethyl methacrylate and/or another acrylic resin, an epoxy resin, a phenol resin, a polyamide resin, a polyimide resin, an unsaturated polyester resin, a polyphenylene sulfide resin and/or another polyphenylene resin, benzocyclobutene, a cardo resin, a siloxane resin, a silsesquioxane resin, and polycarbonate.

4. The display device of claim 1, wherein the first organic layer contacts each of the first interlayer insulating layer and the auxiliary line.

5. The display device of claim 1, further comprising:
   a gate insulating layer disposed between the active layer and the gate electrode and under the fan-out line, wherein the gate electrode and the fan-out line contact an upper surface of the gate insulating layer.

6. The display device of claim 1, wherein the source electrode, the drain electrode, and the auxiliary line are disposed on different layers and include a same material.

7. The display device of claim 1, further comprising:
   a second interlayer insulating layer disposed on the source electrode, the drain electrode, and the auxiliary line;
   a second organic layer disposed on the second interlayer insulating layer on the pad area;
   a voltage line disposed on the second interlayer insulating layer on the display area and on the second organic layer; and
   a third interlayer insulating layer disposed on the voltage line and the second organic layer.

8. The display device of claim 7, wherein
   the second interlayer insulating layer and the third interlayer insulating layer include at least one of silicon oxide, silicon nitride, silicon oxynitride, aluminum oxide, zirconium oxide, and aluminum nitride, and
   the second organic layer includes at least one of polymethyl methacrylate and/or another acrylic resin, an epoxy resin, a phenol resin, a polyamide resin, a polyimide resin, an unsaturated polyester resin, a polyphenylene sulfide resin and/or another polyphenylene resin, benzocyclobutene, a cardo resin, a siloxane resin, a silsesquioxane resin, and polycarbonate.

9. The display device of claim 7, wherein
   the second organic layer does not overlap the display area, and
   the second organic layer overlaps the first organic layer.

10. The display device of claim 9, wherein the second organic layer contacts each of the second interlayer insulating layer and the third interlayer insulating layer.

11. The display device of claim 7, further comprising:
   a first electrode and a second electrode extending in a direction and spaced apart from each other on the third interlayer insulating layer on the display area;
   a light-emitting element having a first end portion and a second end portion disposed on the first electrode and the second electrode, respectively;
   a first connection electrode electrically connected to the first end portion of the light-emitting element; and
   a second connection electrode electrically connected to the second end portion of the light-emitting element.

12. The display device of claim 11, wherein the light-emitting element includes:
   a first semiconductor layer;
   a second semiconductor layer disposed on the first semiconductor layer;
   a light-emitting layer disposed between the first semiconductor layer and the second semiconductor layer; and
   an insulating film surrounding the first semiconductor layer, the second semiconductor layer, and the light-emitting layer.

13. A display device comprising:
   a substrate including a display area, a pad area, and a seal area;
   a transistor including:
      an active layer disposed on the display area;
      a gate electrode disposed on the active layer; and
      a source electrode and a drain electrode disposed on the gate electrode;
   a fan-out line disposed on the pad area and an auxiliary line disposed on the fan-out line;

a first interlayer insulating layer disposed between the gate electrode and the source electrode, between the fan-out line and the auxiliary line, and on the seal area;

a first organic layer disposed between the first interlayer insulating layer and the auxiliary line; and an adhesive member disposed on the first interlayer insulating layer on the seal area, wherein the first organic layer does not overlap the display area, and wherein the first organic layer does not overlap the pad area.

14. The display device of claim 13, wherein the first organic layer contacts each of the first interlayer insulating layer and the auxiliary line.

15. The display device of claim 13, further comprising:

a gate insulating layer disposed between the active layer and the gate electrode and under the fan-out line, wherein both the gate electrode and the fan-out line contact an upper surface of the gate insulating layer.

16. The display device of claim 13, wherein the source electrode, the drain electrode, and the auxiliary line are disposed on different layers and include a same material.

17. The display device of claim 15, further comprising:

a second interlayer insulating layer disposed on the source electrode and the drain electrode on the display area, the auxiliary line on in the pad area, and the first interlayer insulating layer on the seal area;

a second organic layer disposed on the second interlayer insulating layer on the pad area;

a voltage line disposed on the second interlayer insulating layer on the display area and the second organic layer; and a third interlayer insulating layer disposed on the voltage line and the second organic layer.

18. The display device of claim 17, wherein the second organic layer does not overlap the display area, the second organic layer does not overlap the seal area, and the second organic layer overlaps the first organic layer.

19. The display device of claim 17, further comprising:

a first electrode and a second electrode extending in a direction and spaced apart from each other on the third interlayer insulating layer on in the display area;

a light-emitting element having a first end portion and a second end portion disposed on the first electrode and the second electrode, respectively;

a first connection electrode electrically connected to the first end portion of the light-emitting element; and a second connection electrode electrically connected to second end portion of the light-emitting element.

20. The display device of claim 19, further comprising:

an encapsulation layer overlapping the first connection electrode and the second connection electrode and disposed on the display area and on seal area, wherein each of the gate insulating layer, the first interlayer insulating layer, the second interlayer insulating layer, the third interlayer insulating layer, and the encapsulation layer are disposed on the seal area, and the adhesive member is disposed on the encapsulation layer.

* * * * *